United States Patent
Sato

(10) Patent No.: US 9,332,204 B2
(45) Date of Patent: May 3, 2016

(54) AD CONVERSION CIRCUIT AND SOLID-STATE IMAGING DEVICE

(71) Applicant: Kabushiki Kaisha Toshiba, Minato-ku (JP)

(72) Inventor: Maki Sato, Yamato (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/466,418

(22) Filed: Aug. 22, 2014

(65) Prior Publication Data

US 2015/0138413 A1 May 21, 2015

(30) Foreign Application Priority Data

Nov. 15, 2013 (JP) .................................. 2013-237332

(51) Int. Cl.

| | |
|---|---|
| *H04N 5/378* | (2011.01) |
| *H03M 1/14* | (2006.01) |
| *H04N 5/357* | (2011.01) |
| *H04N 5/365* | (2011.01) |
| *H03M 1/56* | (2006.01) |

(52) U.S. Cl.
CPC ................ *H04N 5/378* (2013.01); *H03M 1/14* (2013.01); *H04N 5/3575* (2013.01); *H04N 5/365* (2013.01); *H03M 1/56* (2013.01)

(58) Field of Classification Search
CPC ..... H04N 5/378; H04N 5/3575; H04N 5/365; H03M 1/12
See application file for complete search history.

(56) References Cited

U.S. PATENT DOCUMENTS

| | | | |
|---|---|---|---|
| 7,336,110 B1 * | 2/2008 | Payrard | .................... H03K 4/06 327/131 |
| 7,705,897 B2 | 4/2010 | Muramatsu | |
| 8,350,941 B2 | 1/2013 | Kukita | |
| 8,355,068 B2 | 1/2013 | Kondo | |
| 8,502,899 B2 | 8/2013 | Wakabayashi et al. | |

(Continued)

FOREIGN PATENT DOCUMENTS

| | | |
|---|---|---|
| JP | 2007-281987 | 10/2007 |
| JP | 2010-251957 | 11/2010 |

(Continued)

OTHER PUBLICATIONS

Office Action issued May 21, 2015 in Korean Patent Application No. 10-2014-109430 (with English language translation).

(Continued)

*Primary Examiner* — Jason Flohre
(74) *Attorney, Agent, or Firm* — Oblon, McClelland, Maier & Neustadt, L.L.P.

(57) ABSTRACT

According to one embodiment, in an AD conversion circuit of a single slope type, a counter is configured to count number of clocks, in a state where a potential level of a first slope voltage and a potential level of a second slope voltage concurrently change, until an output signal of either one of a first comparator and a second comparator is inverted. A reference counter is configured to constantly output a full count value. A generation circuit is configured to generate and output a digital value corresponding to a count value of the counter when an output signal of the first comparator is inverted, and to generate and output a digital value corresponding to a value obtained by subtracting a count value of the counter from the full count value of the reference counter when an output signal of the second comparator is inverted.

14 Claims, 19 Drawing Sheets

(56) References Cited

U.S. PATENT DOCUMENTS

| | | | |
|---|---|---|---|
| 8,743,254 B2 | 6/2014 | Wakabayashi et al. | |
| 2006/0220941 A1* | 10/2006 | Lee | H04N 5/378 341/155 |
| 2010/0259660 A1* | 10/2010 | Kukita | H04N 5/23241 348/308 |
| 2011/0025900 A1* | 2/2011 | Kondo | H04N 5/378 348/308 |
| 2011/0037868 A1* | 2/2011 | Ota | H04N 5/357 348/222.1 |
| 2011/0074994 A1 | 3/2011 | Wakabayashi et al. | |
| 2012/0008028 A1 | 1/2012 | Egawa | |
| 2013/0293754 A1 | 11/2013 | Wakabayashi et al. | |
| 2014/0211055 A1 | 7/2014 | Wakabayashi et al. | |

FOREIGN PATENT DOCUMENTS

| | | |
|---|---|---|
| JP | 2011-35689 | 2/2011 |
| JP | 2012-19411 | 1/2012 |
| KR | 10-2011-0014089 A | 2/2011 |
| KR | 10-2011-0014609 A | 2/2011 |

OTHER PUBLICATIONS

Office Action mailed Jan. 9, 2016 in Korean Application No. 10-2014-0109430 (English translation).

* cited by examiner

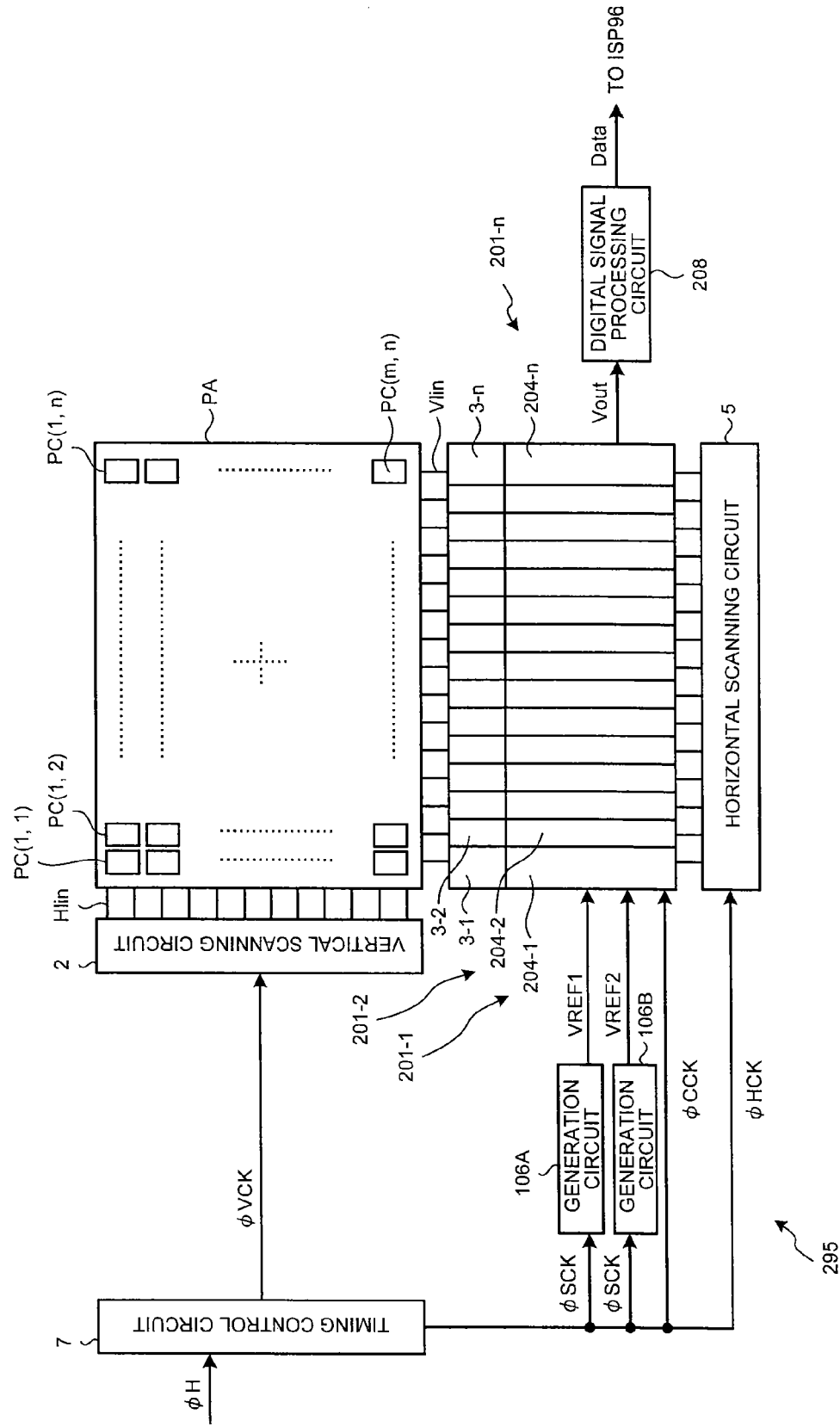

AD CONVERSION CIRCUIT AND SOLID-STATE IMAGING DEVICE

CROSS-REFERENCE TO RELATED APPLICATIONS

This application is based upon and claims the benefit of priority from Japanese Patent Application No. 2013-237332, filed on Nov. 15, 2013; the entire contents of which are incorporated herein by reference.

FIELD

Embodiments described herein relate generally to an AD conversion circuit and solid-state imaging device.

BACKGROUND

In a solid-state imaging device including a plurality of pixels arrayed in a form of a plurality of rows and a plurality of columns, AD conversion circuits of a single slope type are provided to respective columns, so that the AD conversion circuits perform AD conversion of analog signals from the pixels of the respective columns and thereby generate digital signals. Each of the AD conversion circuits coverts the level of a pixel analog signal into time by comparing a ramp-like slope voltage with the pixel analog signal, and counts this time by use of a counter circuit (pixel count). Consequently, the pixel analog signal is converted into a digital value. At this time, in order to improve the performance of the AD conversion circuit, it is desirable to reduce the time necessary for counting the level of an analog signal (pixel count).

BRIEF DESCRIPTION OF THE DRAWINGS

FIG. 13 is a diagram showing a configuration of a solid-state imaging device according to a fourth embodiment;

DETAILED DESCRIPTION

In general, according to one embodiment, there is provided an AD conversion circuit of a single slope type including a first comparator, a second comparator, a counter, a reference counter, and a generation circuit. The first comparator is configured to compare a potential level of a first slope voltage, which temporally changes with a first gradient from a first level to an intermediate level, with a potential level of an analog signal from a pixel. The second comparator is configured to compare a potential level of a second slope voltage, which temporally changes with a second gradient from a second level to the intermediate level, with a potential level of the analog signal from the pixel, the second gradient being inclined opposite to the first gradient. The counter is configured to count number of clocks, in a state where the potential level of the first slope voltage and the potential level of the second slope voltage concurrently change, until an output signal of either one of the first comparator and the second comparator is inverted. The reference counter is configured to constantly output a full count value. The generation circuit is configured to generate and output a digital value corresponding to a count value of the counter when an output signal of the first comparator is inverted, and to generate and output a digital value corresponding to a value obtained by subtracting a count value of the counter from the full count value of the reference counter when an output signal of the second comparator is inverted.

Exemplary embodiments of a solid-state imaging device will be explained below in detail with reference to the accompanying drawings. The present invention is not limited to the following embodiments.

First Embodiment

Figure 15:
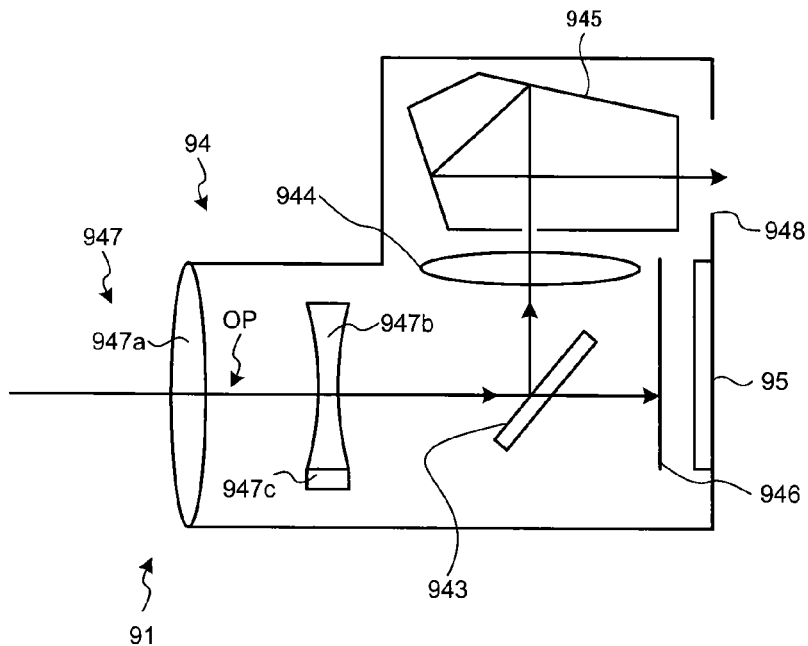
FIG. 15 is a view showing a configuration of an imaging system to which a solid-state imaging device according to a basic form is applied.
Figure 16:
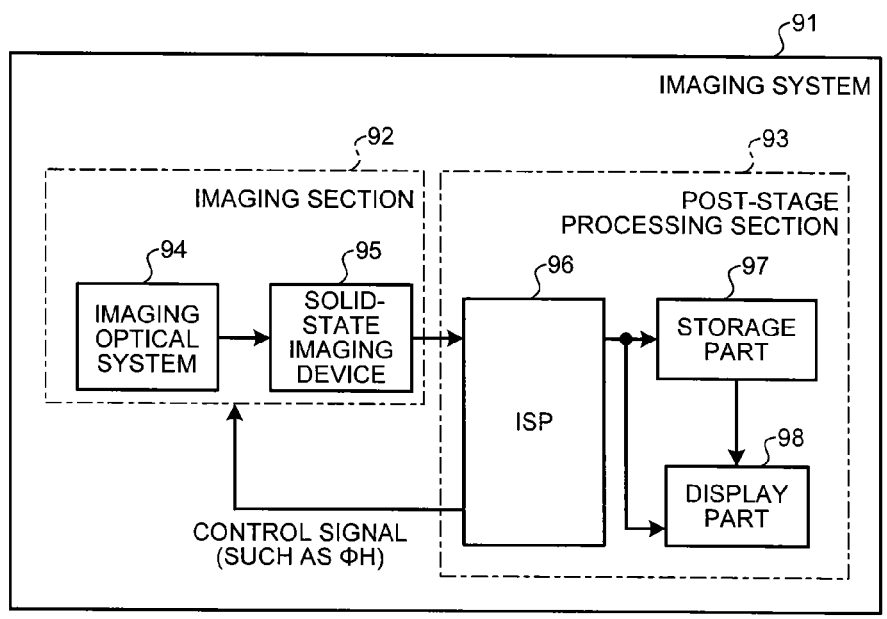
FIG. 16 is a diagram showing a configuration of the imaging system to which the solid-state imaging device according to the basic form is applied.

At first, before an explanation of a solid-state imaging device 195 according to a first embodiment, an explanation will be given of a solid-state imaging device 95 according to a basic form. For example, the solid-state imaging device 95 is applied to an imaging system 91 shown in FIGS. 15 and 16. FIGS. 15 and 16 are a view and a diagram showing schematic configurations of the imaging system 91.

For example, the imaging system 91 may be a digital camera or digital video camera, or it may be an electronic apparatus with a camera module applied thereto (such as a camera-equipped mobile terminal). As shown in FIG. 16, the imaging system 91 includes an imaging section 92 and a post-stage processing section 93. For example, the imaging section 92 is a camera module. The imaging section 92 includes an imaging optical system 94 and a solid-state imaging device 95. The post-stage processing section 93 includes an ISP (Image Signal Processor) 96, a storage part 97, and a display part 98.

The imaging optical system 94 includes a photographing lens 947, a half mirror 943, a mechanical shutter 946, a lens 944, a prism 945, and a finder 948. The photographing lens 947 includes photographing lenses 947a and 947b, a diaphragm (not shown), and a lens drive mechanism 947c. The diaphragm is interposed between the photographing lens 947a and the photographing lens 947b and is configured to adjust the light quantity guided to the photographing lens 947b. FIG. 15 shows an exemplary case where the photographing lens 947 includes the two photographing lens 947a and 947b, but the photographing lens 947 may include more photographing lenses.

The solid-state imaging device 95 is placed on the predetermined image-focusing plane of the photographing lens 947. For example, the photographing lens 947 refracts light incident thereon and guides it through the half mirror 943 and the mechanical shutter 946 to the imaging surface of the solid-state imaging device 95, so that an image of a target object is formed on the imaging surface (pixel array PA) of the solid-state imaging device 95. The solid-state imaging device 95 generates an image signal in accordance with the target object image.

Figure 17:
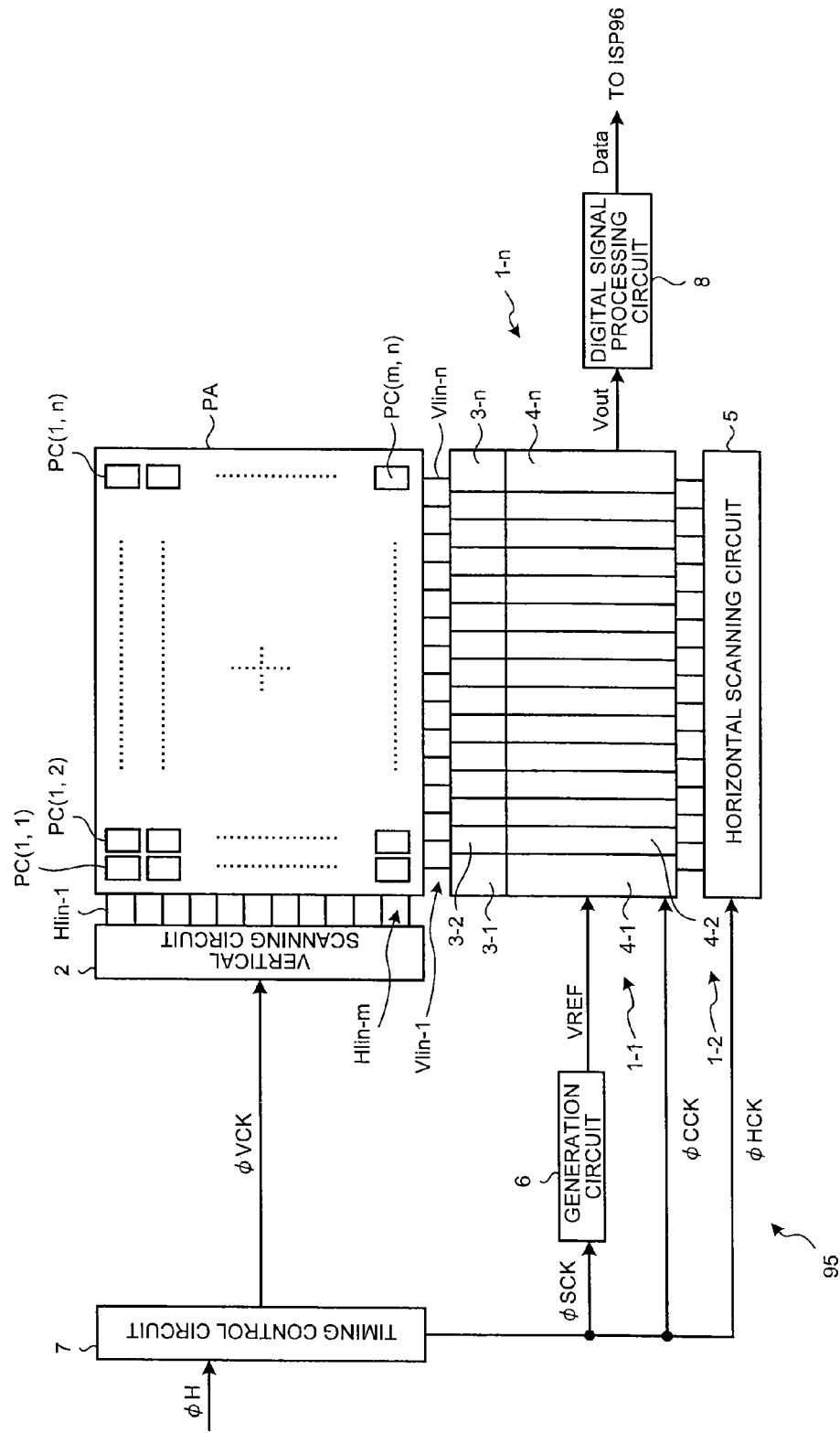
FIG. 17 is a diagram showing a configuration of the solid-state imaging device according to the basic form.
Figure 18:
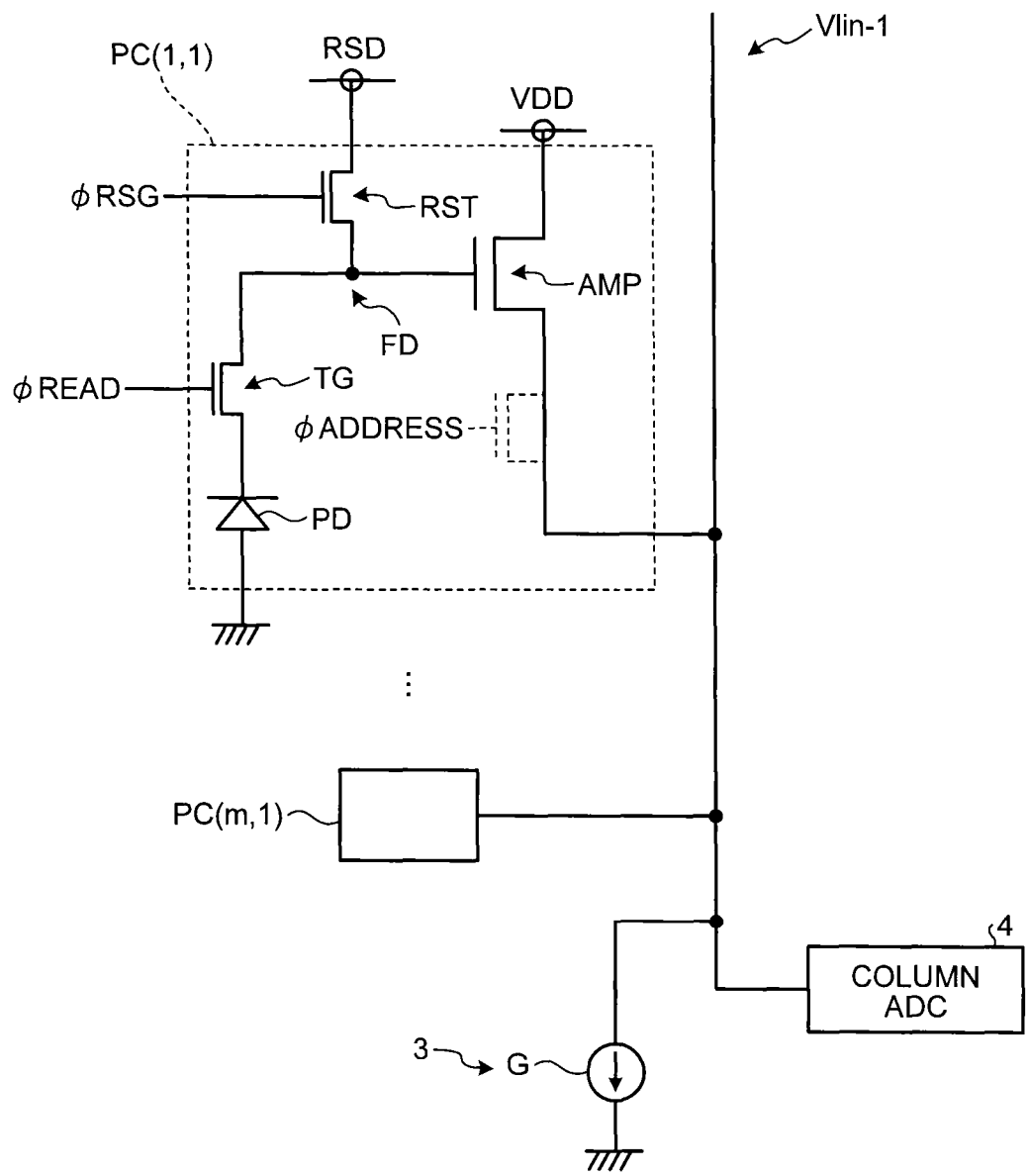
FIG. 18 is a diagram showing a configuration of a pixel according to the basic form.
Figure 19:
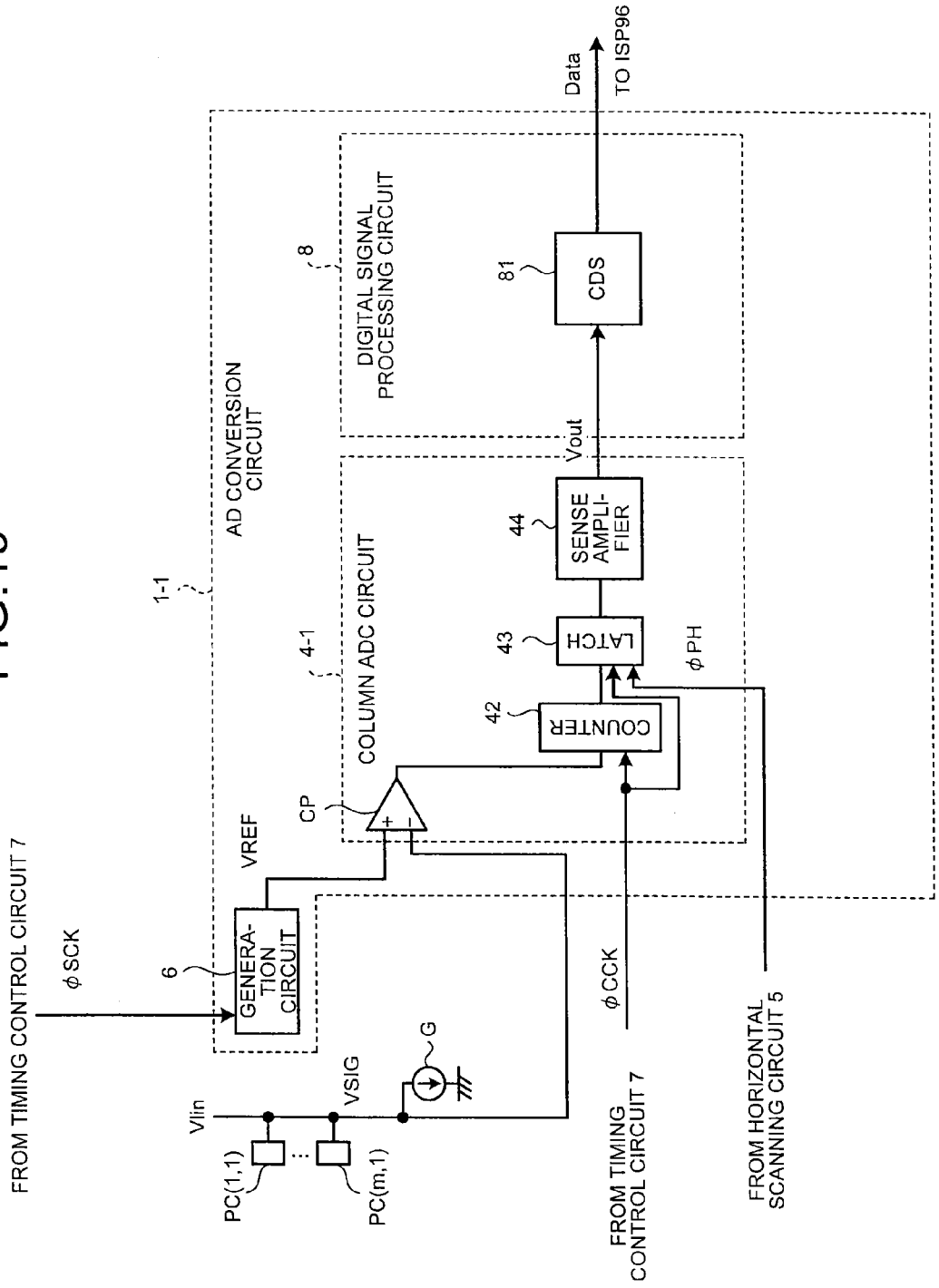
FIG. 19 is a diagram showing a configuration of an AD conversion circuit according to the basic form.
Figure 20:
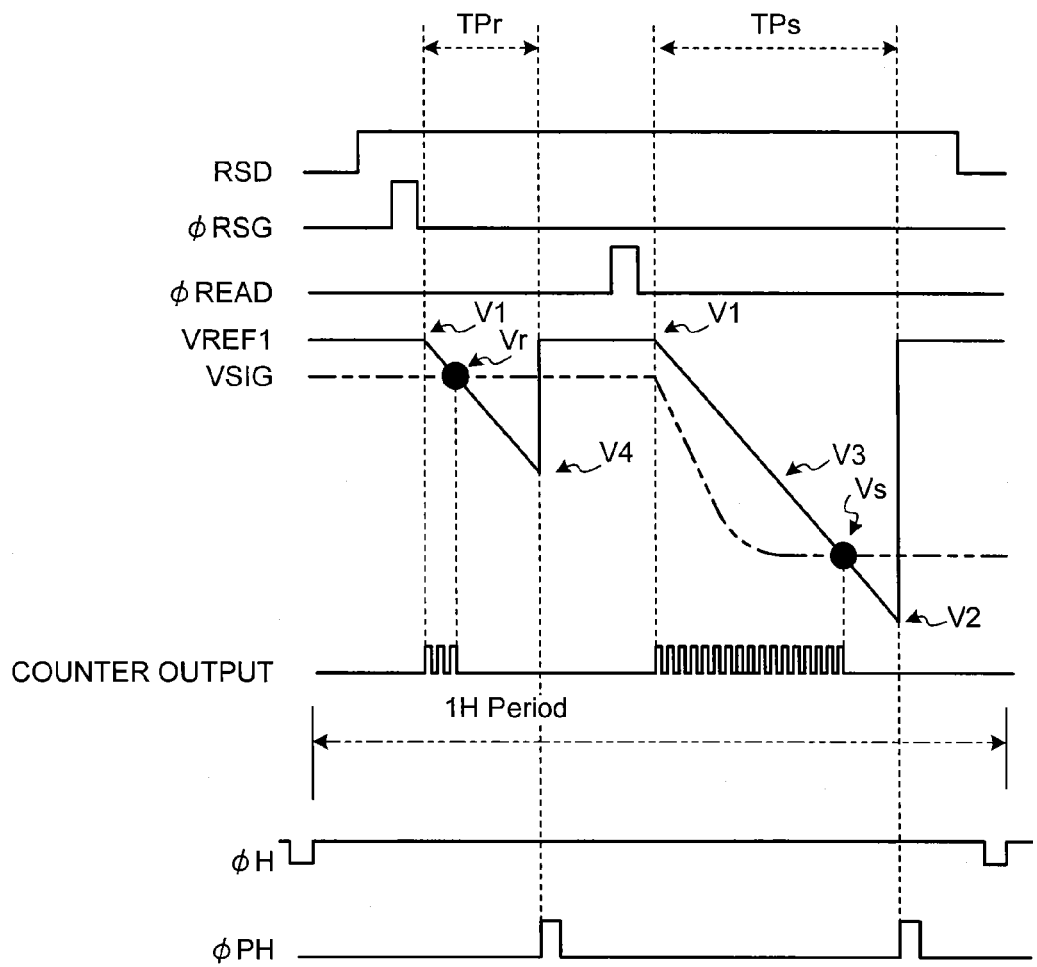
FIG. 20 is a waveform diagram showing an operation of the solid-state imaging device according to the basic form.

Next, an explanation will be given of configurations of the solid-state imaging device 95 according to the basic form, with reference to FIGS. 17 to 20. FIG. 17 is a diagram showing a configuration of the solid-state imaging device 95. FIG. 18 is a diagram showing a configuration of each pixel. FIG. 19 is a diagram showing a configuration of each AD conversion circuit. FIG. 20 is a waveform diagram showing an operation of the solid-state imaging device 95.

As shown in FIG. 17, the solid-state imaging device 95 includes a pixel array PA, a timing control circuit 7, a vertical scanning circuit 2, a plurality of load circuits 3-1 to 3-n, a plurality of AD conversion circuits 1-1 to 1-n, and a horizontal scanning circuit 5.

The pixel array PA includes a plurality of pixels PC(1,1) to PC(m,n) arrayed in a form of a plurality of rows and a plurality of columns. For example, FIG. 17 shows an array of a plurality of pixels PC defined by m-number of rows and n-number of columns, where each of "m" and "n" is an integer of 2 or more.

For example, as shown in FIG. 18, each of the pixels PC includes a photoelectric conversion part PD, a transfer part TG, a charge-voltage conversion part FD, a reset part RST, and an output part AMP. FIG. 18 is a diagram showing a configuration of a pixel PC. FIG. 18 shows a configuration of the pixel PC(1,1) as an example, and the other pixels have similar configuration to this configuration.

The photoelectric conversion part PD performs photoelectric conversion to generate and store an electric charge in accordance with received light. For example, the photoelectric conversion part PD includes a photo diode.

When the transfer part TG receives a control signal ΦREAD at an active level from the vertical scanning circuit 2, it transfers the electric charge of the photoelectric conversion part PD to the charge-voltage conversion part FD. For example, the transfer part TG includes a transfer transistor that functions as a transfer gate, which is turned on by receiving the control signal ΦREAD at an active level on its gate to transfer the electric charge of the photoelectric conversion part PD to the charge-voltage conversion part FD.

The charge-voltage conversion part FD converts the transferred electric charge into a voltage by use of its parasitic capacitance. For example, the charge-voltage conversion part FD comprises a floating diffusion layer.

When the reset part RST receives a control signal ΦRSG at an active level from the vertical scanning circuit 2, it resets the potential of the charge-voltage conversion part FD to a predetermined potential. For example, the reset part RST includes a reset transistor, which is turned on by receiving the control signal bRSG at an active level on its gate to reset the potential of the charge-voltage conversion part FD to a predetermined potential (such as VDD).

The reset part RST performs an operation for making the pixel P into a selected state/non-selected state. For example, the reset part RST may reset the potential of the charge-voltage conversion part FD to a first potential to make the pixel P into the selected state, when the vertical scanning circuit 2 controls a reset power supply RSD to be the first potential (such as VDD). The reset part RST may reset the potential of the charge-voltage conversion part FD to a second potential to make the pixel P into the non-selected state, when the vertical scanning circuit 2 controls the reset power supply RSD to be the second potential (a potential that turns off the output part AMP, such as GND).

When the pixel P is made into the selected state, the output part AMP outputs a signal, which corresponds to a voltage of the charge-voltage conversion part FD, to a signal line Vlin-1. For example, the output part AMP includes an amplifier transistor, and, when the pixel P is made into the selected state, it performs a source follower operation in cooperation with a load current source G connected through the signal line Vlin-1, so that a signal corresponding to a voltage of the charge-voltage conversion part FD is output to the signal line Vlin-1.

As indicated with broken lines in FIG. 18, a selection part ADR (not shown) may be added to this configuration. In this case, the reset power supply RSD may be kept at the first potential (such as VDD). Then, the selection part ADR makes the pixel P into the selected state, upon receiving a control signal ΦADDRESS at an active level from the vertical scanning circuit 2, and, on the other hand, it makes the pixel P into the non-selected state, upon receiving the control signal ΦADDRESS at a non-active level from the vertical scanning circuit 2. For example, the selection part ADR includes a selection transistor, which is turned on by receiving the control signal ΦADDRESS at an active level on its gate to make the pixel P into the selected state, and which is turned off by receiving the control signal ΦADDRESS at a non-active level on its gate to make the pixel P into the non-selected state.

The timing control circuit 7 generates clocks for controlling various timing in accordance with control signals (such as a horizontal synchronization signal ΦH) received from the ISP 96. For example, the timing control circuit 7 generates a clock ΦVCK for vertical scanning in accordance with the horizontal synchronization signal ΦH, and supplies it to the vertical scanning circuit 2. The timing control circuit 7 generates a clock ΦSCK for slope voltage generation in accordance with the horizontal synchronization signal ΦH, and supplies it to a generation circuit 6. The timing control circuit 7 generates a clock ΦCCK for counters in accordance with the horizontal synchronization signal ΦH, and supplies it to each of a plurality of column ADC circuits 4-1 to 4-n. The timing control circuit 7 generates a clock ΦHCK for horizontal scanning in accordance with the horizontal synchronization signal ΦH, and supplies it to the horizontal scanning circuit 5.

The vertical scanning circuit 2 scans the pixel array PA in the vertical direction in accordance with the clock ΦVCK. Thus, the vertical scanning circuit 2 selects a row of pixels to read signals therefrom in the pixel array PA. For example, the vertical scanning circuit 2 supplies a control signal (such as the reset control signal ΦRSG shown in FIG. 18) at an active level to a selected row of pixels through a control line corresponding to the selection row among a plurality of control lines Hlin-1 to Hlin-m. Consequently, the vertical scanning circuit 2 causes the selected row of pixels to output signals therefrom to the signal lines Vlin-1 to Vlin-N of the plurality of columns in parallel.

The plurality of load circuits 3-1 to 3-$n$ are provided to correspond to the plurality of columns of the pixel array PA. Each of the load circuits 3-1 to 3-$n$ includes a load current source G connected to a signal line Vlin of the corresponding column. For example, the load current source G is connected to the signal line Vlin at one end, and is connected to the ground potential at the other end.

The plurality of AD conversion circuits 1-1 to 1-$n$ are provided to correspond to the plurality of columns of the pixel array PA. Each of the AD conversion circuits 1-1 to 1-$n$ comprises an AD conversion circuit of a single slope type, which converts an analog signal of a pixel, read through a signal line Vlin of the corresponding column, into a digital value by use of a slope voltage, and outputs it to the ISP 96. As shown in FIG. 19, each AD conversion circuit 1 includes a generation circuit 6, a column ADC circuit 4, and a digital signal processing circuit 8. As shown in FIG. 17, the plurality of AD conversion circuits 1-1 to 1-$n$ are arranged such that the generation circuit 6 and the digital signal processing circuit 8 are shared by the plurality of column ADC circuits 4-1 to 4-$n$.

FIG. 19 shows the AD conversion circuit 1-1 corresponding to the first column of the pixel array PA as an example, and the other AD conversion circuits 1-2 to 1-$n$ corresponding to the other columns of the pixel array PA have similar configuration to this configuration.

The generation circuit 6 generates a slope voltage VREF with predetermined timing in accordance with the clock ΦSCK, and supplies it to each of the plurality of column ADC circuits 4-1 to 4-$n$. The slope voltage VREF has a ramp-like waveform that temporally changes with a first gradient (<0) from a level V1.

As shown in FIG. 20, in a time period TPr for sampling the reset level of the pixel PC, the slope voltage VREF temporally changes with the first gradient (<0) from the level V1 to a level V4. In a time period TPs for sampling the signal level of the pixel PC, the slope voltage VREF temporally changes with the first gradient from the level V1 through an intermediate level V3 to a level V2. The intermediate level V3 is a level intermediate between the level V1 and the level V2. The reset level of the pixel PC is expected to be closer to the level V1 than the signal level of the pixel PC is, and so the level V4 can be made of a level closer to the level V1 than the intermediate level V3 is.

As shown in FIG. 17, the plurality of column ADC circuits 4-1 to 4-$n$ are provided to correspond to the plurality of columns of the pixel array PA. Each of the column ADC circuits 4-1 to 4-$n$ performs AD conversion of a signal (analog signal) read from a pixel through a signal line Vlin of the corresponding column, and thereby generates a digital signal Vout.

As shown in FIG. 19, each of the column ADC circuits 4-1 to 4-$n$ includes a comparator CP, a counter 42, a latch circuit 43, and a sense amplifier 44.

The comparator CP compares the potential level of the slope voltage VREF and the potential level of the pixel signal (analog signal) with each other, and outputs the comparison result to the counter 42. For example, the comparator CP outputs a bit value "1" when the potential level of the slope voltage VREF is higher than the potential level of the pixel signal (analog signal), and it outputs a bit value "0" when the potential level of the slope voltage VREF is lower than the potential level of the pixel signal (analog signal). Thus, the comparator CP inverts its comparison result and outputs the result, when the magnitude relationship between the potential level of the slope voltage VREF and the potential level of the pixel signal (analog signal) is inverted.

The counter 42 receives the comparison result from the comparator CP, and receives the clock ΦCCK from the timing control circuit 7. The counter 42 counts the number of clocks (the number of pulses of the clock OCCK) from the time when the potential level of the slope voltage VREF starts changing to the time when the comparison result of the comparator CP is inverted. For example, the counter 42 is configured to start a counting operation when the potential level of the slope voltage VREF starts changing, and to stop the counting operation when the comparison result of the comparator CP is inverted. The counter 42 outputs the count value to the latch circuit 43. The counter 42 has the number of bits N that corresponds to the cycle of the clock ΦCCK and the time width of the slope voltage VREF. The counter 42 is configured to start counting up from a zero count value, in accordance with a count given by the clock ΦCCK, at the timing when the potential level of the slope voltage VREF starts changing from the level V1, and to reach the full count value of the N bits at the timing when the slope voltage VREF becomes the level V2 at the full amplitude. For example, if the counter 42 is a counter of 10 bits, the full count value is a count of 1,024. Alternatively, for example, if the counter 42 is a counter of 11 bits, the full count value is a count of 2,048.

As shown in FIG. 20, in the time period TPr for sampling the reset level of the pixel PC, a reset level Vr output from the output part AMP is input to the comparator CP as the level of a signal line potential VSIG, in a state where the charge-voltage conversion part FD has been reset by the reset part RST. As regards the reset level Vr, the counter 42 counts the number of clocks from the time when the potential level of the slope voltage VREF starts changing to the time when the comparison result of the comparator CP is inverted, and outputs the count value of the reset level Vr to the latch circuit 43. The count value of the reset level Vr corresponds to the level difference between the level V1 and the reset level Vr. Thus, the counter 42 converts the level difference between the level V1 and the reset level Vr into time, and counts this time (pixel count).

In the time period TPs for sampling the signal level of the pixel PC, a signal level Vs output from the output part AMP is input to the comparator CP as the level of the signal line potential VSIG, in a state where the electric charge of the photoelectric conversion part PD has been transferred to the charge-voltage conversion part FD by the transfer part TG. As regards the signal level Vs, the counter 42 counts the number of clocks from the time when the potential level of the slope voltage VREF starts changing to the time when the comparison result of the comparator CP is inverted, and outputs the count value of the signal level Vs to the latch circuit 43. The count value of the signal level Vs corresponds to the level difference between the level V1 and the signal level Vs. Thus, the counter 42 converts the level difference between the level V1 and the signal level Vs into time, and counts this time (pixel count).

The latch circuit 43 receives the count value from counter 42, and receives the clock ΦCCK from the timing control circuit 7. The latch circuit 43 receives a horizontal scanning pulse ΦPH from the horizontal scanning circuit 5 in the horizontal period of this column. The latch circuit 43 latches the count value of the counter 42 in synchronization with the clock ΦCCK, and transfers the count value to the sense amplifier 44 at the timing when the horizontal scanning pulse ΦPH turns to an active level.

As shown in FIG. 20, the latch circuit 43 transfers the count value of the reset level Vr to the sense amplifier 44 after the time period TPr for sampling the reset level of the pixel PC is completed. The latch circuit 43 transfers the count value of the signal level Vs to the sense amplifier 44 after the time period TPs for sampling the signal level of the pixel PC is completed.

The sense amplifier 44 receives each count value from the latch circuit 43. The sense amplifier 44 amplifies a signal representing the count value and outputs it as a digital signal Vout to the digital signal processing circuit 8.

The horizontal scanning circuit 5 scans the plurality of column ADC circuits 4-1 to 4-n in the horizontal direction in accordance with the clock ΦHCK. Thus, the horizontal scanning circuit 5 sequentially selects the plurality of column ADC circuits 4-1 to 4-n, and transfers a digital signal as Vout from each of them to the digital signal processing circuit 8.

The digital signal processing circuit 8 receives the digital signal Vout from each of the column ADC circuits 4-1 to 4-n of the respective columns. The digital signal processing circuit 8 generates a digital value Data corresponding to a count value of the counter 42, and outputs it to the ISP 96, in the horizontal period of each column.

For example, as shown in FIG. 19, the digital signal processing circuit 8 includes a CDS circuit 81. The CDS circuit 81 performs a correlation double sampling (CDS) process on the digital signal Vout, and thereby generates the digital value Data. For example, when the CDS circuit 81 receives the digital signal Voutr corresponding to the count value of the reset level Vr, it holds the digital signal Voutr. Then, when the CDS circuit 81 receives the digital signal Vouts corresponding to the count value of the signal level Vs, it obtains the difference between the digital signal Voutr and the digital signal Vouts, and outputs this difference as the digital value Data. Consequently, it is possible to remove influences of the fixed pattern noise of the pixel, which is included in the pixel signal, so as to generate and output a highly accurate digital value.

As shown in FIG. 20, in each horizontal period (1H Period) for processing the pixel signal of one column to output it as the digital value Data, the time period TPs for sampling the signal level of the pixel PC occupies a large proportion of time. The length of the time period TPs for sampling the signal level is determined by the time width between the levels V1 and V2 of the slope voltage VREF. Accordingly, in a case where the cycle of the clock ΦCCK is constant, if the number of bits in the counter 42 is increased to improve the pixel count accuracy, the time width between the levels V1 and V2 of the slope voltage VREF needs to be larger. In this case, the time period TPs for sampling the signal level of the pixel PC is prolonged, and so each horizontal period tends to be prolonged.

For example, if the counter 42 is a counter of 10 bits and the full count value of the counter 42 is a count of 1,024, the time period TPs needs to have a length for the count of 1,024. Alternatively, for example, if the counter 42 is a counter of 11 bits and the full count value of the counter 42 is a count of 2,048, the time period TPs needs to have a length for the count of 2,048.

If each horizontal period is prolonged, the frame rate of image signals output from the solid-state imaging device 95 may exceed the required length. If the frame rate exceeds the required length, in a case where an image obtained by image signals is a moving image, it becomes difficult to secure a frame number in a predetermined time and so it becomes difficult to obtain a smooth moving image. Alternatively, in a case where an image obtained by image signals is a still image, such a frame rate brings about an increase in release time lag and so it may become difficult to surely release the shutter at the right moment.

In light of this, the first embodiment proposes to reduce the pixel count time by using two slope voltages concurrently changing and by performing comparison of the signal level with these two slope voltages in parallel. Hereinafter in this embodiment, parts different from those of the basic form will be mainly described.

Figure 1:
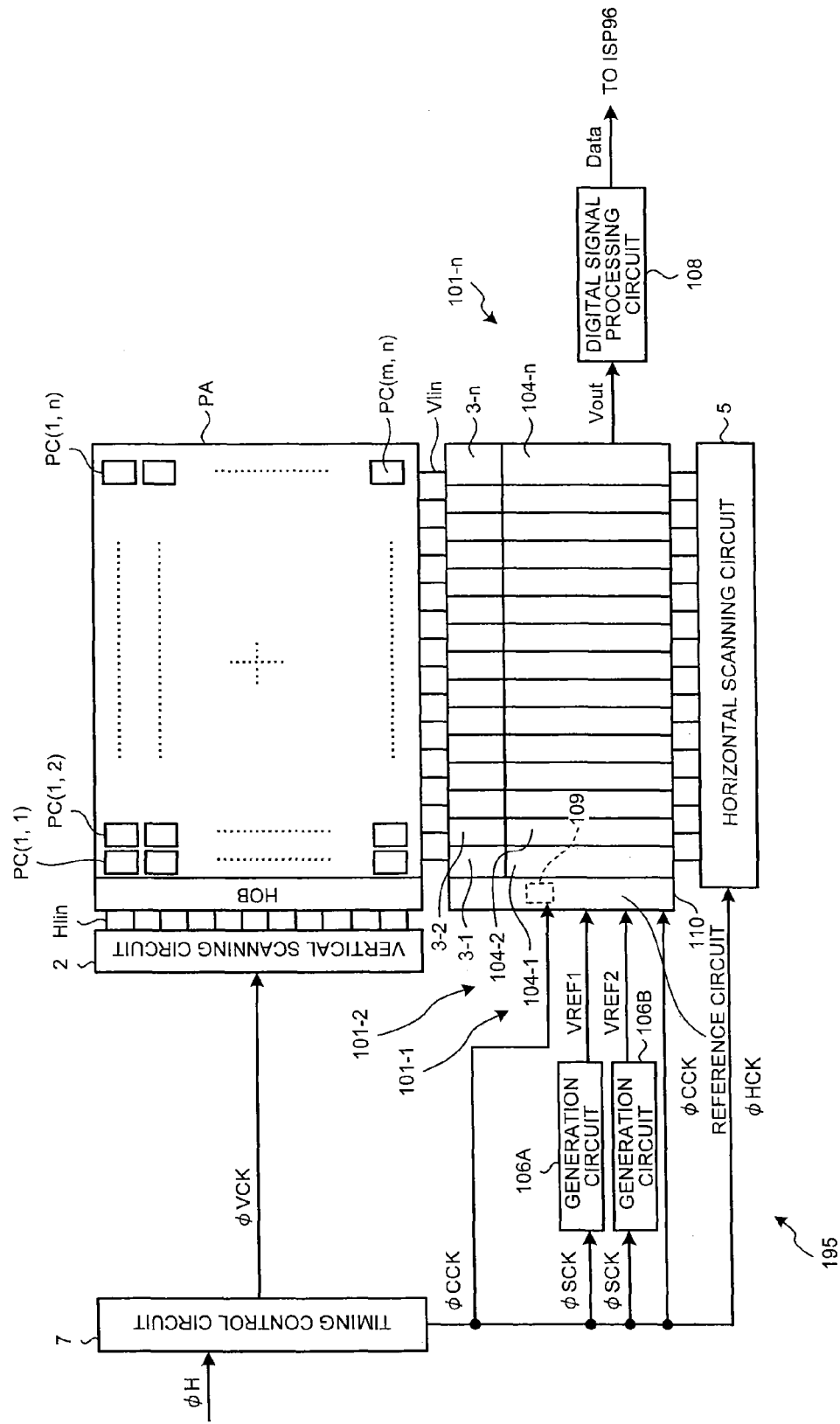
FIG. 1 is a diagram showing a configuration of a solid-state imaging device according to a first embodiment.
Figure 2:
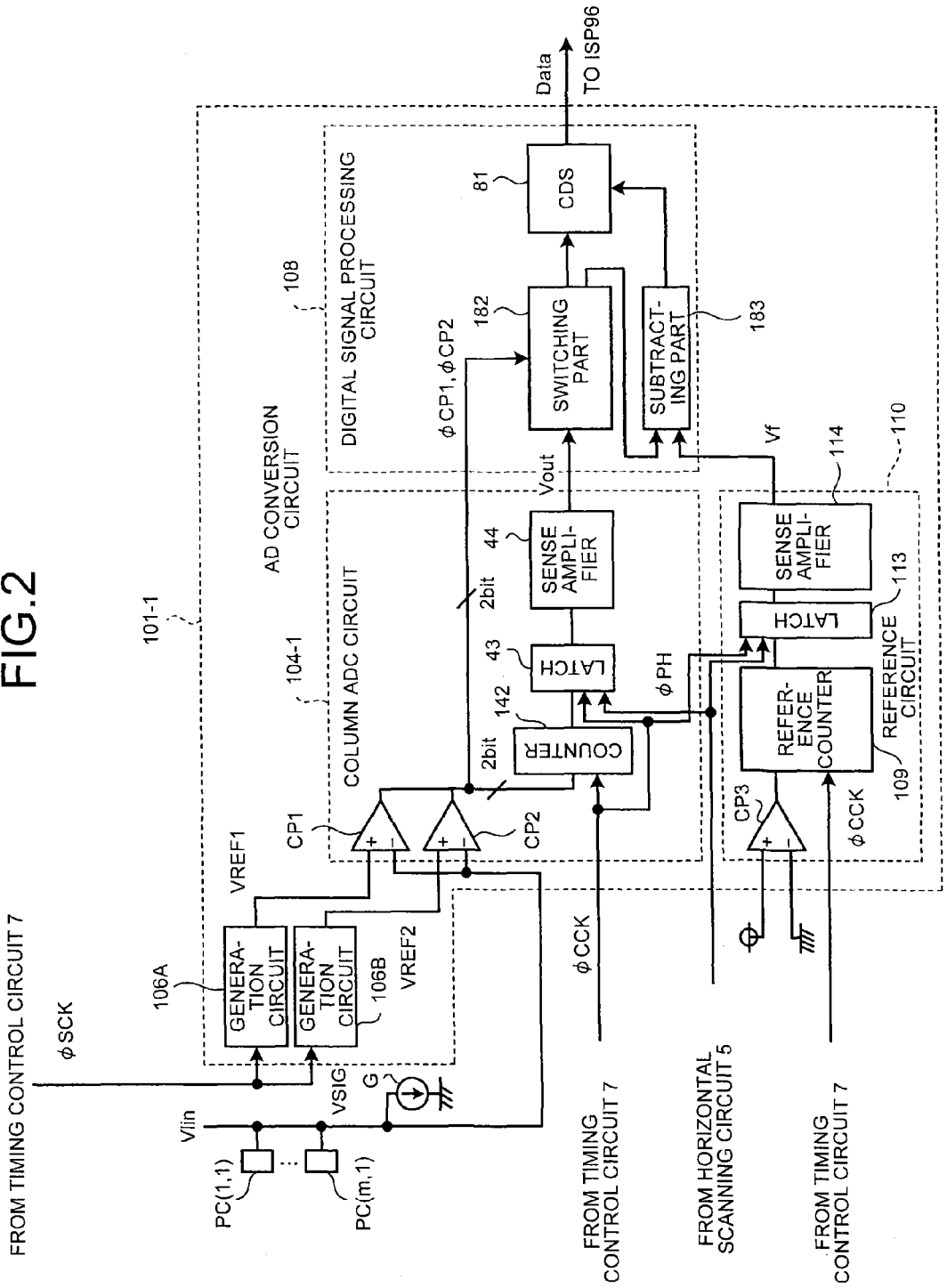
FIG. 2 is a diagram showing a configuration of an AD conversion circuit according to the first embodiment.

Specifically, as shown in FIG. 1, the solid-state imaging device 195 includes a plurality of AD conversion circuits 101-1 to 101-n in place of the plurality of AD conversion circuits 1-1 to 1-n (see FIG. 17). As shown in FIG. 2, each AD conversion circuit 101 includes a generation circuit 106A, a generation circuit 106B, a column ADC circuit 104, and a digital signal processing circuit (generation circuit) 108 in place of the generation circuit 6, the column ADC circuit 4, and the digital signal processing circuit 8, and it further includes a reference circuit 110 containing a reference counter 109. As shown in FIG. 1, the plurality of AD conversion circuits 101-1 to 101-n are arranged such that the generation circuit 106A, the generation circuit 106B, the reference circuit 110 containing the reference counter 109, and the digital signal processing circuit 108 are shared by the plurality of column ADC circuits 104-1 to 104-n.

It should be noted that, although FIG. 2 shows the AD conversion circuit 101-1 corresponding to the first column of a pixel array PA as an example, the other AD conversion circuits 101-2 to 101-n corresponding to the other columns of the pixel array PA have similar configuration to this configuration.

The generation circuit 106A generates a first slope voltage VREF1 with predetermined timing in accordance with a clock ΦSCK, and supplies it to each of the plurality of column ADC circuits 104-1 to 104-n. The first slope voltage VREF1 has a ramp-like waveform that temporally changes with a first gradient (<0) from a level V1.

Figure 4:
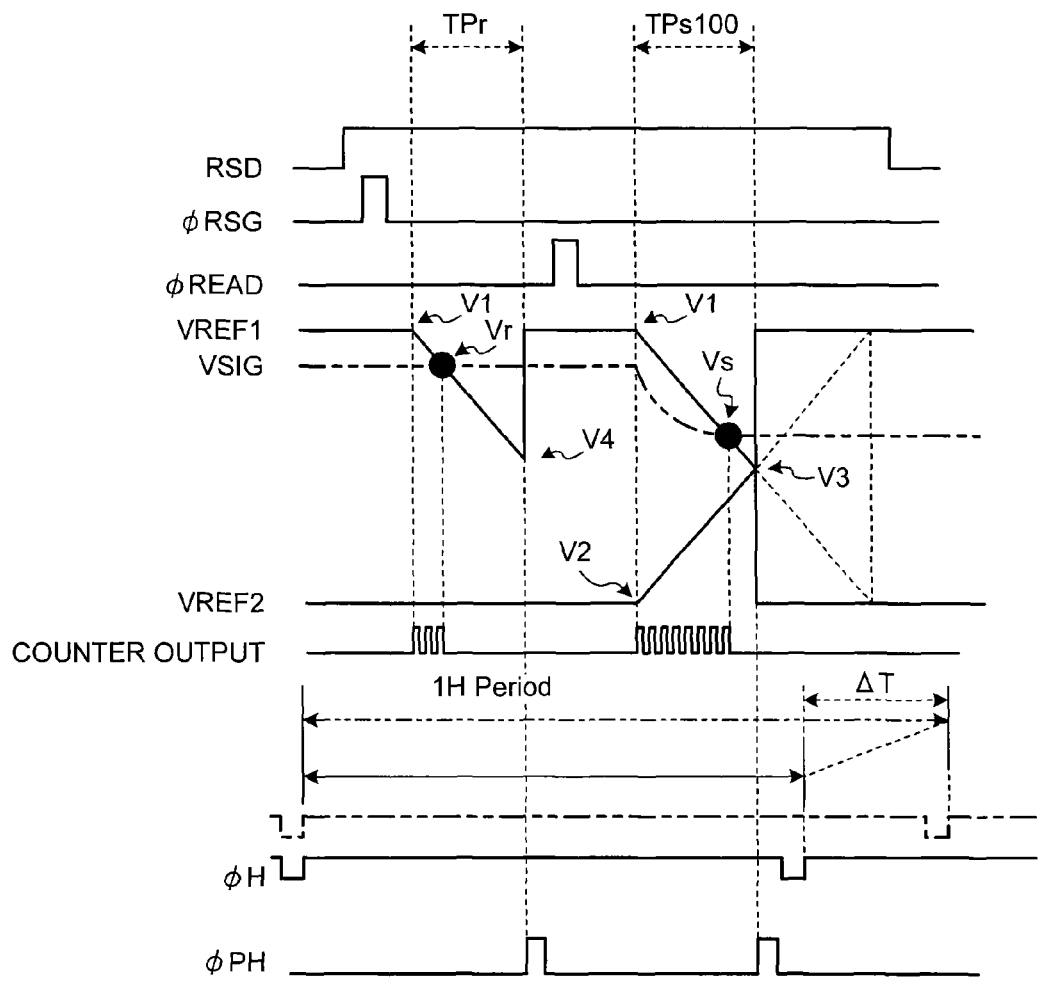
FIG. 4 is a waveform diagram showing an operation of the solid-state imaging device according to the first embodiment.
Figure 5:
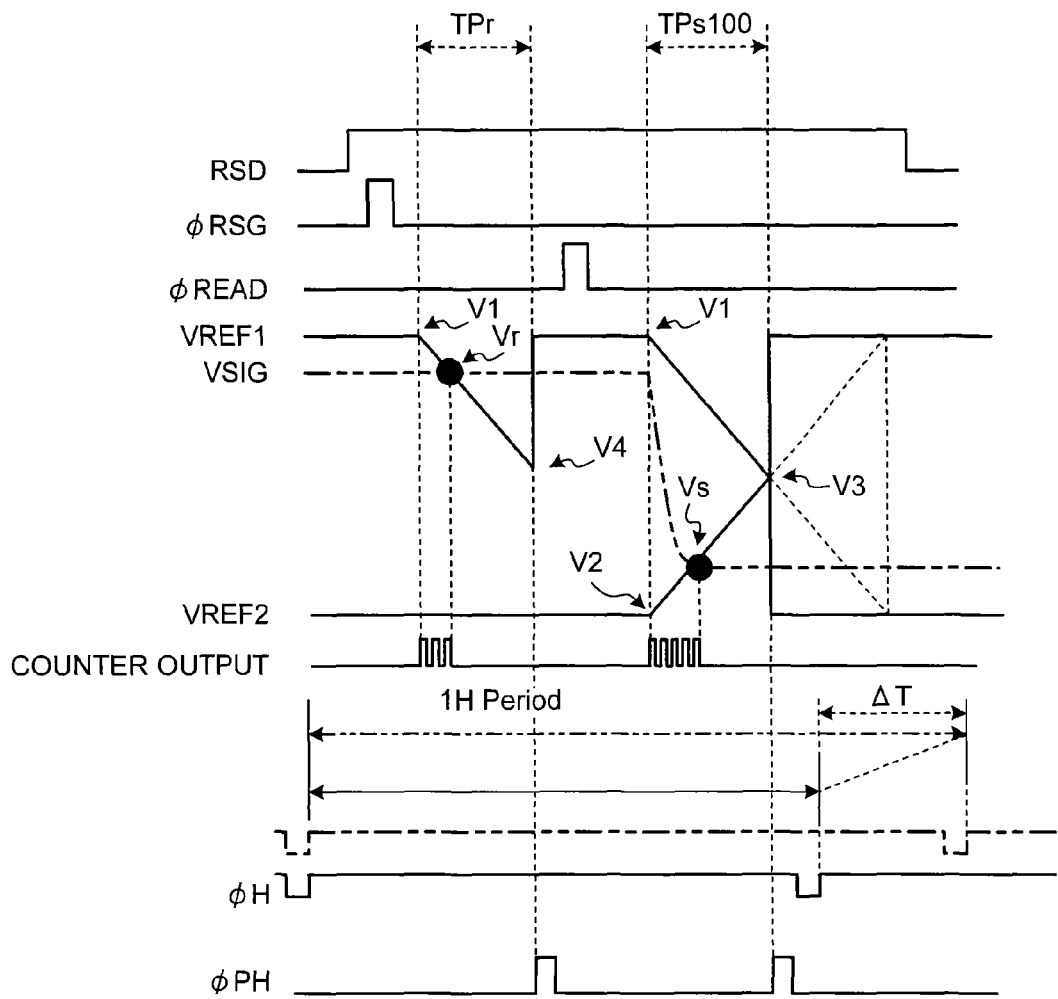
FIG. 5 is a waveform diagram showing an operation of the solid-state imaging device according to the first embodiment.

As shown in FIGS. 4 and 5, in a time period TPr for sampling the reset level of the pixel PC, the first slope voltage VREF1 temporally changes with the first gradient (<0) from the level V1 to a level V4. In a time period TPs100 for sampling the signal level of the pixel PC, the first slope voltage VREF1 temporally changes with the first gradient from the level V1 to an intermediate level V3. The intermediate level V3 is a level intermediate between the level V1 and the level V2. The level V1 is a level corresponding to the zero count value of the counter 42 of the basic form (see FIG. 19). The level V2 is a level corresponding to the full count value of the counter 42 of the basic form. The intermediate level V3 is a level corresponding to a count value intermediate between the zero count value of the counter 42 and the full count value of the counter 42.

The generation circuit 106B generates a second slope voltage VREF2 with predetermined timing in accordance with the clock ΦSCK, and supplies it to each of the plurality of column ADC circuits 104-1 to 104-n. The second slope voltage VREF2 has a ramp-like waveform that temporally changes with a second gradient (>0) from the level V2.

As shown in FIGS. 4 and 5, in the time period TPr for sampling the reset level of the pixel PC, the second slope voltage VREF2 does not temporally change but is kept at the level V2. In the time period TPs100 for sampling the signal level of the pixel PC, the second slope voltage VREF2 temporally changes with the second gradient from the level V2 to the intermediate level V3. The second gradient is inclined opposite to the first gradient. For example, the second gradient may have an absolute value of the gradient equal to that of the first gradient.

As shown in FIG. 2, the reference circuit 110 has a configuration corresponding to each column ADC circuit 4. For example, the reference circuit 110 includes a reference comparator CP3, a reference counter 109, a latch circuit 43, and a sense amplifier 44.

The reference comparator CP3 includes two input terminals, such that one terminal is connected to a power supply potential VDD and the other terminal is connected to a ground potential GND. In this case, the reference comparator CP3 compares two potential levels, whose magnitude relationship is not to be inverted, and so it outputs a constant comparison result (such as a bit value "1") to the reference counter 109.

The reference counter 109 receives the comparison result from the reference comparator CP3, and receives the clock ΦCCK from the timing control circuit 7. The reference counter 109 counts the number of clocks (the number of pulses of the clock ΦCCK), in synchronization with the clock ΦCCK, until the comparison result of the reference comparator CP3 is inverted. The reference counter 109 is configured to stop the counting operation at the full count value. Since the reference comparator CP3 outputs a constant comparison result as described above, the reference counter 109 counts up to the full count value and stops the counting operation when the count value reaches the full count value. Then, the reference counter 109 constantly outputs the full count value to the digital signal processing circuit 108.

The reference counter 109 has the number of bits equal to the number of bits of the counter 42 of the basic form (see FIG. 19). For example, if the counter 42 of the basic form is a counter of N bits, the reference counter 109 is a counter of N bits. Accordingly, the full count value of the reference counter 109 is equal to the full count value of the counter 42 of the basic form, and is a value corresponding to the potential level V2 of the slope voltage VREF at the full amplitude (see FIG. 20).

It should be noted that the reference counter 109 may perform a process for counting up to the full count value during a time period of the initialization process at the startup or the like of the solid-state imaging device 195. At this time, it suffices if the reference counter 109 completes the process for counting up to the full count value before the timing when a pixel signal read at first from the plurality of pixels in the pixel array PA is processed by the digital signal processing circuit 108.

The latch circuit 113 receives the full count value from the reference counter 109, and receives the clock ΦCCK from the timing control circuit 7. The latch circuit 113 receives a horizontal scanning pulse ΦPH from the horizontal scanning circuit 5 in the horizontal period of this column. The latch circuit 113 latches the full count value of the reference counter 109 in synchronization with the clock ΦCCK, and transfers the full count value to the sense amplifier 114 at the timing when the horizontal scanning pulse ΦPH turns to an active level.

The sense amplifier 114 receives the full count value from the latch circuit 113. The sense amplifier 114 amplifies a signal representing the full count value and outputs it as a digital signal Vf to the digital signal processing circuit 8.

Figure 3:
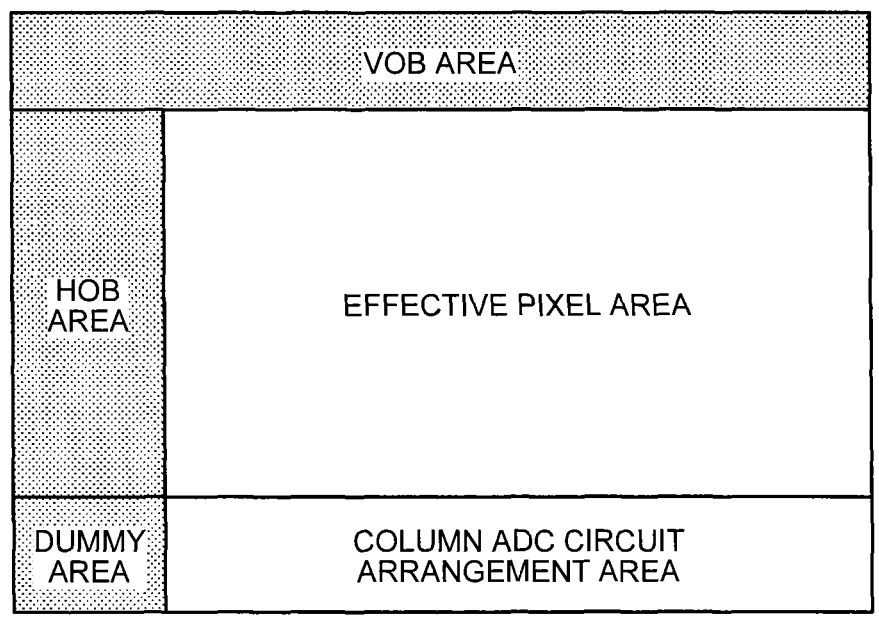
FIG. 3 is a view showing a reference counter arrangement area (dummy area) according to the first embodiment.

The reference comparator CP3 and the reference counter 109 may be arranged in a dummy area shown in FIG. 3. For example, there may be a case where a VOB area and an HOB area, which are used for performing OB correction of effective pixel signals, are formed around an effective pixel area including a plurality of effective pixels for imaging a target object in the pixel array PA. The column ADC circuit arrangement area adjacent to the effective pixel area includes the plurality of column ADC circuits 104-1 to 104-n formed therein. On the other hand, each of the VOB area and HOB area includes a plurality of light shielding pixels formed therein. In the case of OB correction performed in an analog manner, there is no need to perform AD conversion of signals from the light shielding pixels. On the other hand, in the case of OB correction performed in a digital manner, the column ADC circuits 104-1 to 104-n can be used for performing AD conversion. The dummy area adjacent to the HOB area and the column ADC circuit arrangement area remains as an unused area. Accordingly, if the reference comparator CP3 and the reference counter 109 are arranged in the dummy area, the layout area of the plurality of AD conversion circuits 101-1 to 101-n is prevented from increasing.

As shown in FIG. 2, each of the column ADC circuits 104-1 to 104-n includes a comparator CP1, a comparator CP2, and a counter 142 in place of the comparator CP and the counter 42 (see FIG. 19).

The number of bits of the counter 142 may be equal to the number of bits of the counter 42 of the basic form (see FIG. 19) or it may be one-bit smaller than the number of bits of the counter 42. For example, if the counter 42 of the basic form is a counter of N bits, the counter 142 may be a counter of N bits or a counter of N−1 bits. When the counter 142 is a counter of N−1 bits, the circuit scale of the counter 142 can be reduced, as compared to the counter 42 of the basic form.

The comparator CP1 compares the potential level of the first slope voltage VREF1 and the potential level of the pixel signal (analog signal) with each other, and outputs the comparison result ΦCP1 to the counter 142 and the digital signal processing circuit 108. For example, the comparator CP1 outputs a bit value "1" when the potential level of the first slope voltage VREF1 is higher than the potential level of the pixel signal (analog signal), and it outputs a bit value "0" when the potential level of the first slope voltage VREF1 is lower than the potential level of the pixel signal (analog signal). Thus, the comparator CP1 inverts its comparison result ΦCP1 and outputs the result, when the magnitude relationship between the potential level of the first slope voltage VREF1 and the potential level of the pixel signal (analog signal) is inverted.

The comparator CP2 compares the potential level of the second slope voltage VREF2 and the potential level of the pixel signal (analog signal) with each other, and outputs the comparison result ΦCP2 to the counter 142 and the digital signal processing circuit 108. For example, the comparator CP2 outputs a bit value "1" when the potential level of the second slope voltage VREF2 is higher than the potential level of the pixel signal (analog signal), and it outputs a bit value "0" when the potential level of the second slope voltage VREF2 is lower than the potential level of the pixel signal (analog signal). Thus, the comparator CP2 inverts its comparison result ΦCP2 and outputs the result, when the magnitude relationship between the potential level of the second slope voltage VREF2 and the potential level of the pixel signal (analog signal) is inverted.

The counter 142 receives the comparison results ΦCP1 and ΦCP2 respectively from the comparators CP1 and CP2, and receives the clock ΦCCK from the timing control circuit 7. The counter 142 counts the number of clocks (the number of pulses of the clock ΦCCK) from the time when the potential levels of the slope voltages start changing to the time when either one of the comparison results ΦCP1 and ΦCP2 of the two comparators CP1 and CP2 is inverted. Specifically, in a state where the potential level of the first slope voltage VREF1 and the potential level of the second slope voltage VREF2 concurrently change and where the two comparators CP1 and CP2 perform the comparing operations in parallel, the counter 142 counts the number of clocks until the output signal of either one of the comparator CP1 and the comparator CP2 is inverted. The counter 142 outputs the count value to the latch circuit 43.

For example, when V1<Vs<V3 is satisfied, the comparison result ΦCP1 of the comparator CP1 out of the two comparators CP1 and CP2 is inverted. As shown in FIG. 4, in the time period TPs100 for sampling the signal level of the pixel PC, a signal level Vs output from the output part AMP is input to each of the two comparators CP1 and CP2 as the level of a signal line potential VSIG, in a state where the electric charge of the photoelectric conversion part PD has been transferred to the charge-voltage conversion part FD by the transfer part TG. As regards the signal level Vs, the counter 142 counts the number of clocks from the time when the potential level of the first slope voltage VREF1 starts changing to the time when the comparison result ΦCP1 of the comparator CP1 is inverted, and outputs the count value of the signal level Vs to the latch circuit 43. The count value of the signal level Vs corresponds to the level difference between the level V1 and the signal level Vs. Thus, the counter 142 converts the level difference between the level V1 and the signal level Vs into time, and counts this time (pixel count).

For example, when V3<Vs<V2 is satisfied, the comparison result ΦCP2 of the comparator CP2 out of the two comparators CP1 and CP2 is inverted. As shown in FIG. 5, in the time period TPs100 for sampling the signal level of the pixel PC, a signal level Vs output from the output part AMP is input to each of the two comparators CP1 and CP2 as the level of the signal line potential VSIG, in a state where the electric charge of the photoelectric conversion part PD has been transferred to the charge-voltage conversion part FD by the transfer part TG. As regards the signal level Vs, the counter 142 counts the number of clocks from the time when the potential level of the second slope voltage VREF2 starts changing to the time when the comparison result ΦCP2 of the comparator CP2 is inverted, and outputs the count value of the signal level Vs to the latch circuit 43. The count value of the signal level Vs corresponds to the level difference between the level V2 and the signal level Vs. Thus, the counter 142 converts the level difference between the level V2 and the signal level Vs into time, and counts this time (pixel count).

The digital signal processing circuit 108 receives the output signals ΦCP1 and ΦCP2 of the comparators CP1 and CP2 and the digital signal Vout from each of the column ADC circuits 4-1 to 4-n of the respective columns. When the output signal ΦCP1 of the comparator CP1 is inverted in the horizontal period of each column, the digital signal processing circuit 108 generates and outputs a digital value Data corresponding to a count value of the counter 142. On the other hand, when the output signal ΦCP2 of the comparator CP2 is inverted in the horizontal period of each column, the digital signal processing circuit 108 generates and outputs a digital value Data corresponding to a value obtained by subtracting a count value of the counter 142 from the full count value of the reference counter 109.

For example, as shown in FIG. 2, the digital signal processing circuit 108 further includes a switching part 182 and a subtracting part 183.

The switching part 182 receives the output signals ΦCP1 and ΦCP2 respectively from the comparators CP1 and CP2, and receives the digital signal Vout from the sense amplifier 44 of each column. In accordance with the output signals ΦCP1 and ΦCP2, the switching part 182 can recognize which one of the output signals of the two comparators CP1 and CP2 has been inverted. When the output signal ΦCP1 of the comparator CP1 is inverted, the switching part 182 transfers the digital signal Vouts corresponding to the count value of the signal level Vs of the counter 142 to the output side of the digital signal processing circuit 108 to bypass the subtracting part 183. Thus, when the output signal ΦCP1 of the comparator CP1 is inverted, the switching part 182 transfers the digital signal Vouts to the CDS circuit 81.

On the other hand, when the output signal ΦCP2 of the comparator CP2 is inverted, the switching part 182 transfers the digital signal Vouts corresponding to the count value of the signal level Vs of the counter 142 to the subtracting part 183.

The subtracting part 183 receives the digital signal Vouts from the sense amplifier 44 through the switching part 182, and receives the digital signal Vf corresponding to the full count value from the reference counter 109 through the latch circuit 113 and the sense amplifier 114. When the subtracting part 183 receives the digital signal Vouts corresponding to the count value of the signal level Vs of the counter 142 through the switching part 182, it subtracts the count value of the counter 142 from the full count value of the reference counter 109. The subtracting part 183 outputs the subtraction result to the output side of the digital signal processing circuit 108. Thus, the subtracting part 183 converts a count value corresponding to the level difference between the level V2 and the signal level Vs into the essential signal level that is a count value corresponding to the level difference between the level V1 and the signal level Vs (see FIGS. 4 and 5). Then, the subtracting part 183 transfers the subtraction result serving as its conversion result to the CDS circuit 81.

When the CDS circuit 81 receives the digital signal Vouts corresponding to the count value of the signal level Vs, it obtains the difference between the digital signal Voutr and the digital signal Vouts, and outputs this difference as the digital value Data.

For example, when V1<Vs<V3 is satisfied, the digital signal processing circuit 108 performs an arithmetic operation in accordance with the following formula 1.

(Digital value)=(Count value of signal level $Vs$)−
(Count value of reset level $Vr$)      Formula 1

For example, if the count value of the reset level Vr is a count of 64 and the count value of the signal level Vs is a count of 300, it makes the digital value=300−64=236 (count).

For example, when V3<Vs<V2 is satisfied, the digital signal processing circuit 108 performs an arithmetic operation in accordance with the following formula 2.

(Digital value)=(Count value of reference counter 109)−(Count value of signal level $Vs$)−(Count value of reset level $Vr$)      Formula 2

For example, if the full count value of the reference counter 109 is a count of 1024, the count value of the reset level Vr is a count of 64, and the count value of the signal level Vs is a count of 300, it makes the digital value=1,024−300−64=660 (count).

As shown in FIGS. 4 and 5, in each horizontal period (1H Period) for processing the pixel signal of one column to output it as the digital value Data, each of the time width between the levels V1 and V3 of the first slope voltage VREF1 and the time width between the levels V2 and V3 of the second slope voltage VREF2, which are used for sampling the signal level Vs in the time period TPs100, can be reduced to almost a half of the time width between the levels V1 and V2 of the slope voltage VREF of the basic form.

For example, if the counter 109 is a counter of 10 bits and the full count value of the counter 109 is a count of 1,024, the time period TPs100 can be reduced to a length of 512, which is a half of the count of 1,024. Alternatively, for example, if the counter 109 is a counter of 11 bits and the full count value of the counter 109 is a count of 2,048, the time period TPs100 can be reduced to a length of 1,024, which is a half of the count of 2,048.

Consequently, the time period TPs100 for sampling the signal level of the pixel PC can be reduced to almost a half of the time period TPs for sampling the signal level of the pixel PC in the basic form. It follows that the length of each horizontal period can be shortened by ΔT, as shown in FIGS. 4 and 5.

As described above, according to the first embodiment, the AD conversion circuit 101 of each of the columns of the solid-state imaging device 195 is configured such that, in a state where the potential level of the first slope voltage VREF1 and the potential level of the second slope voltage VREF2 concurrently change and where the two comparators CP1 and CP2 perform the comparing operations in parallel, the counter 142 counts the number of clocks until the output signal of either one of the two comparators CP1 and CP2 is inverted. Consequently, the time width of each of the slope voltages used for sampling the signal level can be reduced to almost a half of that of the basic form, and so it is possible to reduce the time necessary for counting the pixel signal level (pixel count). Further, the reference counter 109 constantly outputs the full count value to the digital signal processing circuit 108. The digital signal processing circuit 108 generates and outputs a digital value corresponding to a count value of the counter 142 when the output signal of the comparator CP1 is inverted, and, on the other hand, it generates and outputs a digital value corresponding to a value obtained by subtracting a count value of the counter 142 from the full count value of the reference counter 109 when the output signal of the comparator CP2 is inverted. In this case, since the full count value is constantly provided, it is possible to perform at a high speed a process for converting a count value of the signal level into a count value of the actual signal level, when the signal level Vs is closer to the pixel saturation level V2 than the intermediate level V3. Consequently, it is possible to reduce the time necessary for counting the essential signal level (pixel count), and so it is possible to reduce the total time necessary for performing the pixel count to generate and output a digital value (one horizontal period).

It follows that, even when the number of bits of the counter 142 is increased to improve the pixel count accuracy, it is possible to reduce the total time necessary for performing the pixel count to generate and output a digital value (one horizontal period). Thus, it is possible to improve the pixel count accuracy and to reduce the length of one horizontal period.

Further, according to the first embodiment, the digital signal processing circuit 108 of the AD conversion circuit 101 is configured such that, when the output signal ΦCP1 of the comparator CP1 is inverted, the switching part 182 transfers the count value of the counter 142 to the output side of the digital signal processing circuit 108 to bypass the subtracting part 183. When the output signal ΦCP2 of the comparator CP2 is inverted, the switching part 182 transfers the count value of the counter 142 to the subtracting part 183. When the subtracting part 183 receives the count value of the counter 142 through the switching part 182, it subtracts the count value of the counter 142 from the full count value of the reference counter 109, and outputs the subtraction result to the output side of the digital signal processing circuit 108. Thus, this configuration can generate and output a digital value corresponding to a count value of the counter 142 when the output signal of the comparator CP1 is inverted, and, on the other hand, it can generate and output a digital value corresponding to a value obtained by subtracting a count value of the counter 142 from the full count value of the reference counter 109 when the output signal of the comparator CP2 is inverted.

Second Embodiment

Next, an explanation will be given of a solid-state imaging device 195i according to a second embodiment. Hereinafter in this embodiment, parts different from those of the first embodiment will be mainly described.

The first embodiment uses one comparator CP1 to perform sampling of the reset level Vr, but the second embodiment uses two comparators CP1 and CP2 in parallel to perform sampling of the reset level Vr.

Figure 6:
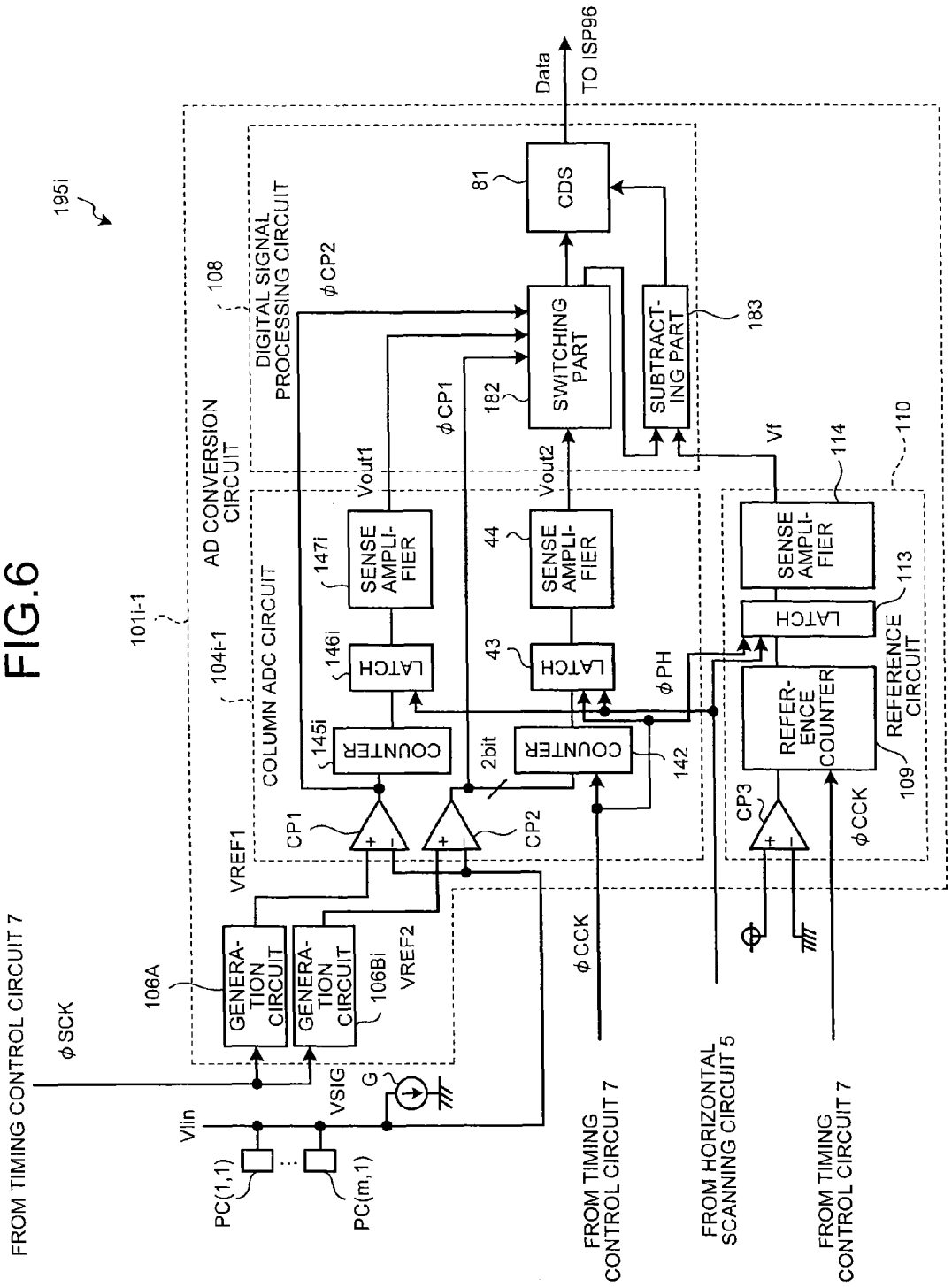
FIG. 6 is a diagram showing a configuration of an AD conversion circuit according to a second embodiment.

Specifically, in the solid-state imaging device 195i, the AD conversion circuit of each column is configured, for example, as shown in FIG. 6. FIG. 6 is a diagram showing a configuration of the AD conversion circuit of each column. FIG. 6 shows the AD conversion circuit 101i-1 corresponding to the first column of a pixel array PA as an example, and the other AD conversion circuits corresponding to the other columns of the pixel array PA have similar configuration to this configuration.

The AD conversion circuit 101i-1 includes a generation circuit 106Bi and a column ADC circuit 104i-1 in place of the generation circuit 106B and the column ADC circuit 104-1 (see FIG. 2)

The generation circuit 106Bi generates a second slope voltage VREF2 having a ramp-like waveform not only in the time period TPs100 for sampling the signal level of the pixel PC but also in the time period TPr for sampling the reset level of the pixel PC.

Figure 7:
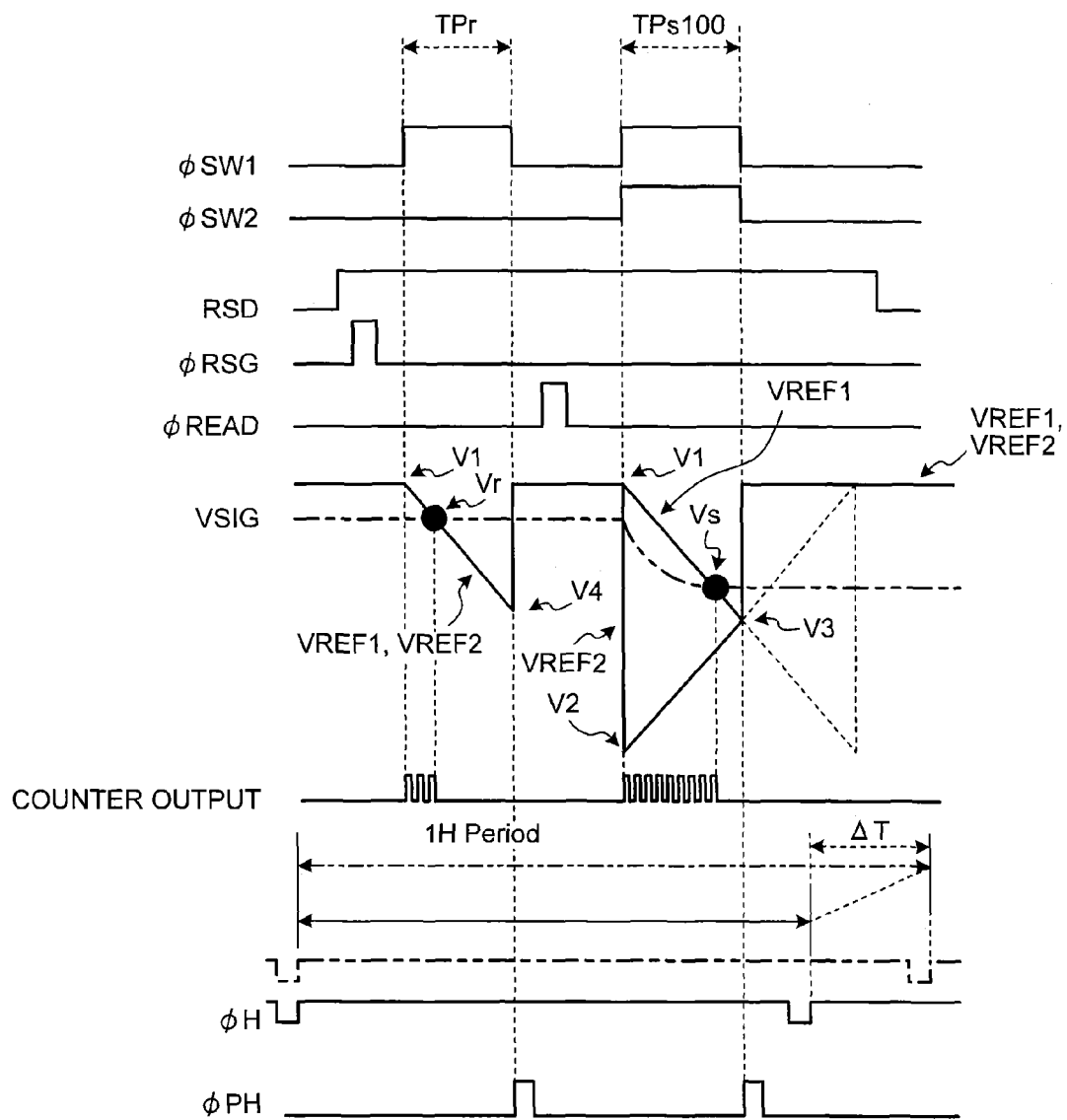
FIG. 7 is a waveform diagram showing an operation of a solid-state imaging device according to the second embodiment.
Figure 8:
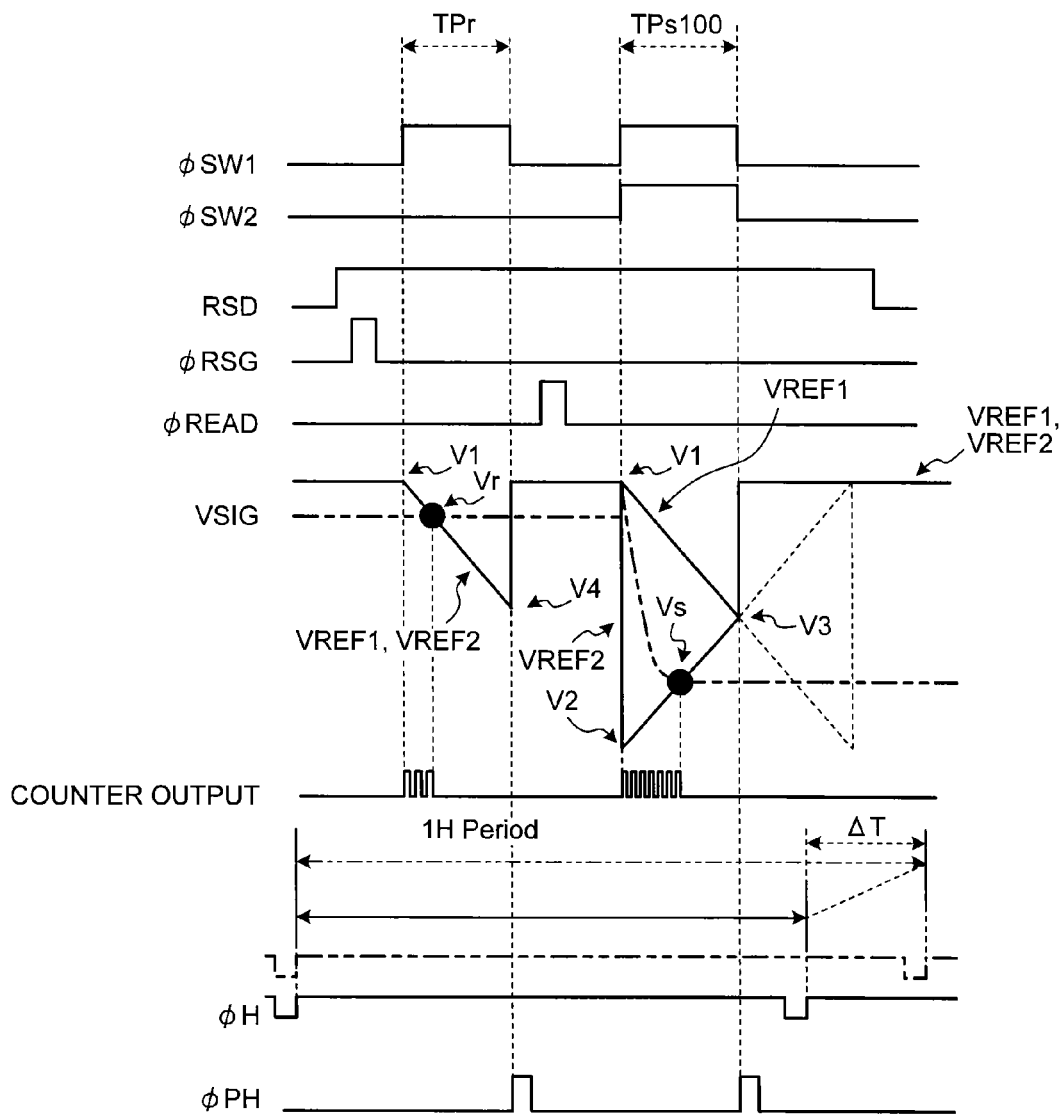
FIG. 8 is a waveform diagram showing an operation of the solid-state imaging device according to the second embodiment.

As shown in FIGS. 7 and 8, in the time period TPr for sampling the reset level of the pixel PC, the second slope voltage VREF2 temporally changes with a first gradient (<0) from a level V1 to a level V4. On the other hand, in the time period TPs100 for sampling the signal level of the pixel PC, the second slope voltage VREF2 temporally changes with a second gradient from a level V2 to an intermediate level V3. The second gradient is inclined opposite to the first gradient.

For example, each of the generation circuit 106A and the generation circuit 106Bi includes an integration circuit (not shown) to perform an integration operation to generate the first slope voltage VREF1 and the second slope voltage VREF2. In the time period TPr, the respective integration circuits of the generation circuit 106A and the generation circuit 106Bi are supplied with electric currents of the same polarity, so that they perform integration operations of the same polarity as each other. Then, at the timing of starting the time period TPs100, the polarity of the electric current flowing through the integration circuit of the generation circuit 106Bi is temporarily reversed, and, at the timing of ending the time period TPs100, the polarity of the electric current flowing through the integration circuit of the generation circuit 106Bi is returned to the same polarity as the generation circuit 106A. Consequently, the second slope voltage VREF2 is set to have a waveform shown in FIGS. 7 and 8.

The column ADC circuit 104i-1 further includes a counter 145i, a latch circuit 146i, and a sense amplifier 147i. In the column ADC circuit 104i-1, the comparison result of the comparator CP1 is input to the counter 145i, and the comparison result of the comparator CP2 is input to the counter 142. The counter 145i performs its counting operation in parallel with the counter 142 performing its counting operation. The latch circuit 146i latches the count value of the counter 145i and transfers it to the sense amplifier 147i, and in parallel with this, the latch circuit 43 latches the count value of the counter 142 and transfers it to the sense amplifier 44. Further, the sense amplifier 147i outputs a digital signal Vout1 to the switching part 182, and in parallel with this, the sense amplifier 44 outputs a digital signal Vout2 to the switching part 182. The digital signal Vout1 is a digital signal corresponding to a count value of the counter 145i, and the digital signal Vout2 is a digital signal corresponding to a count value of the counter 142.

For example, when V1<Vs<V3 is satisfied, the comparison result ΦCP1 of the comparator CP1 out of the two comparators CP1 and CP2 is inverted, as shown in FIG. 7. On the other hand, for example, when V3<Vs<V2 is satisfied, the comparison result ΦCP2 out of the comparator CP2 of the two comparators CP1 and CP2 is inverted, as shown in FIG. 8.

In the digital signal processing circuit 108, the switching part 182 transfers both of the digital signal Voutr1 corresponding to the count value of the reset level Vr of the counter 145i and the digital signal Voutr2 corresponding to the count value of the reset level Vr of the counter 142 to the CDS circuit 81. The CDS circuit 81 holds the digital signal Voutr1 and digital signal Voutr2.

When the output signal ΦCP1 of the comparator CP1 is inverted, the switching part 182 transfers the digital signal Vouts1 corresponding to the count value of the signal level Vs of the counter 145i to the output side of the digital signal processing circuit 108 to bypass the subtracting part 183. Thus, when the output signal ΦCP1 of the comparator CP1 is inverted, the switching part 182 transfers the digital signal Vouts1 to the CDS circuit 81. At this time, the switching part 182 may discard the digital signal Vouts2 corresponding to the count value of the signal level Vs of the counter 142.

On the other hand, when the output signal ΦCP2 of the comparator CP2 is inverted, the switching part 182 transfers the digital signal Vouts2 corresponding to the count value of the signal level Vs of the counter 142 to the subtracting part 183. At this time, the switching part 182 may discard the digital signal Vouts1 corresponding to the count value of the signal level Vs of the counter 145i.

When the CDS circuit 81 receives the digital signal Vouts1 corresponding to the count value of the signal level Vs of the counter 145i, it performs a CDS process by use of the digital signal Voutr1 corresponding to the digital signal Vouts1. Specifically, the CDS circuit 81 obtains the difference between the digital signal Voutr1 and the digital signal Vouts1, and outputs this difference as a digital value Data.

On the other hand, when the CDS circuit 81 receives the digital signal Vouts2 corresponding to the count value of the signal level Vs of the counter 142 through the subtracting part 183, it performs a CDS process by use of the digital signal Voutr2 corresponding to the digital signal Vouts2. Specifically, the CDS circuit 81 obtains the difference between the digital signal Voutr2 and the subtracted result obtained by subtracting the digital signal Vouts2 from the full count value, and outputs this difference as a digital value Data.

As described above, according to the second embodiment, the AD conversion circuit 101i of each of the columns of the solid-state imaging device 195i is configured such that the two comparators CP1 and CP2 are used in parallel to perform sampling of the reset level Vr of a pixel PC, and then the two comparators CP1 and CP2 are also used in parallel to perform sampling of the signal level Vs. In this case, when the output signal of either one of the two comparators CP1 and CP2 is inverted in the sampling of the signal level Vs, a CDS process can be performed by use of digital signals sampled by the same comparator for both of the reset level Vr and the signal level Vs. Consequently, it is possible to perform the CDS process by removing influences of the comparator offset in addition to those of the fixed pattern noise, so as to generate and output a further highly accurate digital value.

Third Embodiment

Next, an explanation will be given of a solid-state imaging device 195J according to a third embodiment. Hereinafter in this embodiment, parts different from those of the first embodiment will be mainly described.

The first embodiment performs sampling of the signal level Vs at one time, but the third embodiment performs sampling of the signal level Vs a plurality of times. In other words, the third embodiment performs multi-sampling.

Figure 9:
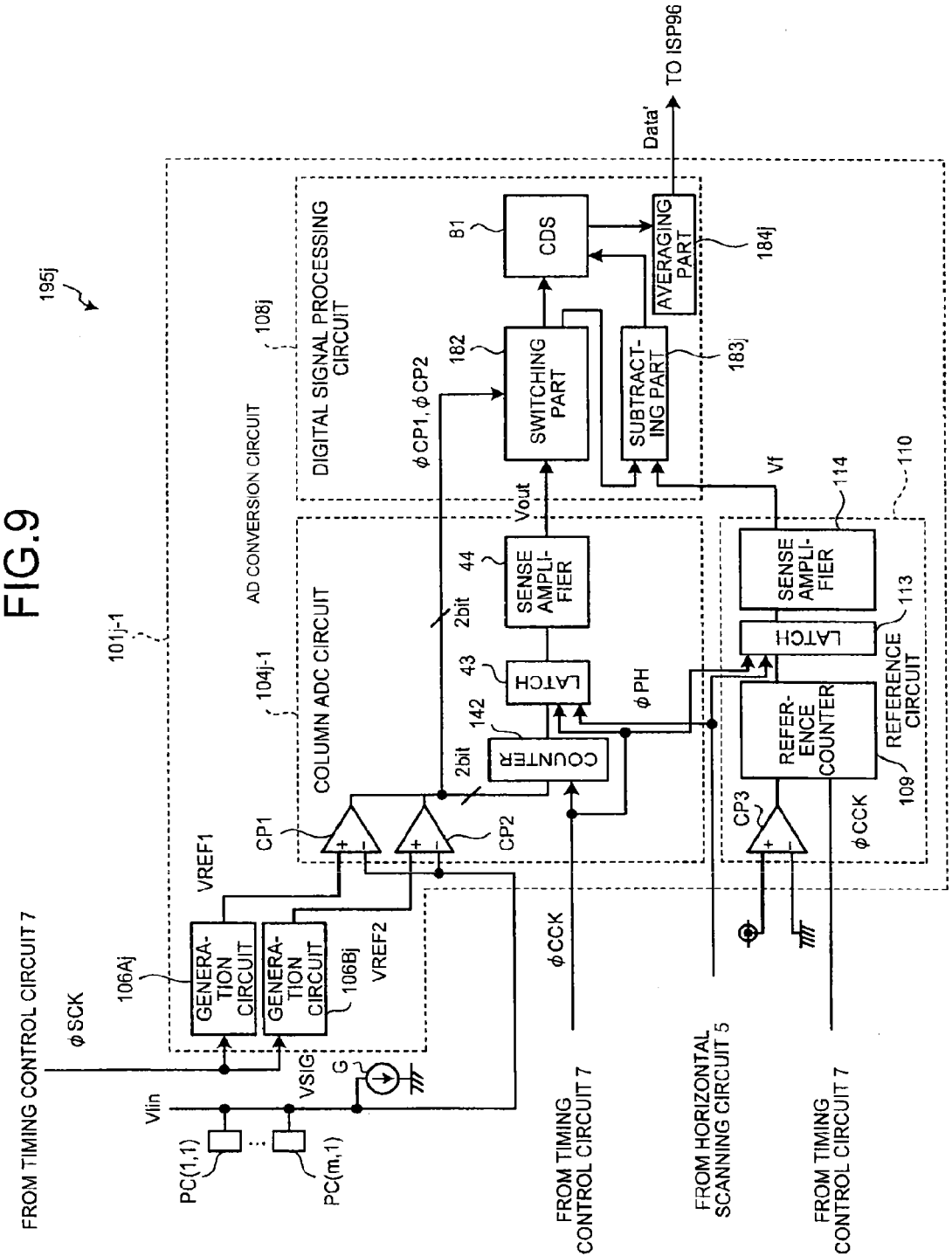
FIG. 9 is a diagram showing a configuration of an AD conversion circuit according to a third embodiment.

Specifically, in the solid-state imaging device 195j, the AD conversion circuit of each column is configured, for example, as shown in FIG. 9. FIG. 9 is a diagram showing a configuration of the AD conversion circuit of each column. FIG. 9 shows the AD conversion circuit 101j-1 corresponding to the first column of a pixel array PA as an example, and the other AD conversion circuits corresponding to the other columns of the pixel array PA have similar configuration to this configuration.

The AD conversion circuit 101j-1 includes a generation circuit 106Aj, a generation circuit 106Bj, and a digital signal processing circuit 108j in place of the generation circuit 106A, the generation circuit 106B, and the digital signal processing circuit 108 (see FIG. 2). The digital signal processing circuit 108j further includes an averaging part 184j.

The generation circuit 106Aj generates a first slope voltage VREF1 having a plurality of ramp-like waveforms in the time period TPs for sampling the signal level of the pixel PC.

Figure 10:
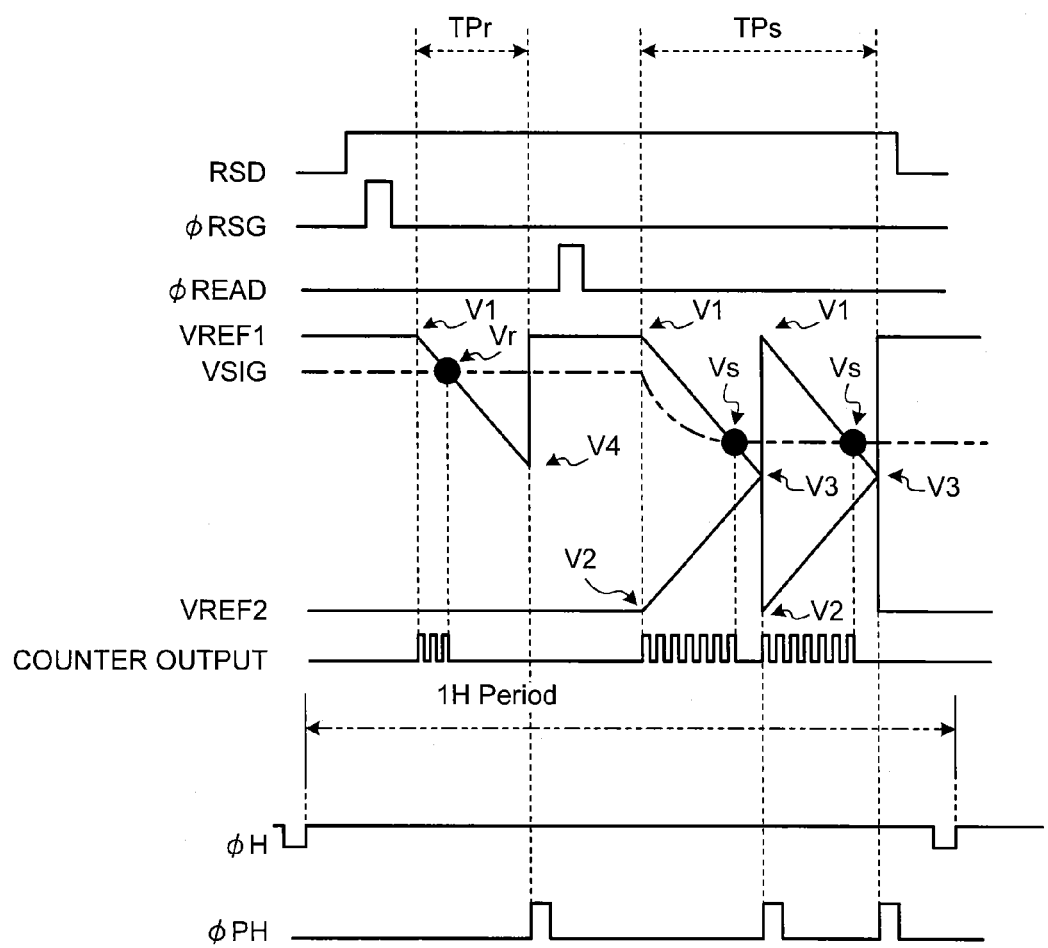
FIG. 10 is a waveform diagram showing an operation of a solid-state imaging device according to the third embodiment.
Figure 11:
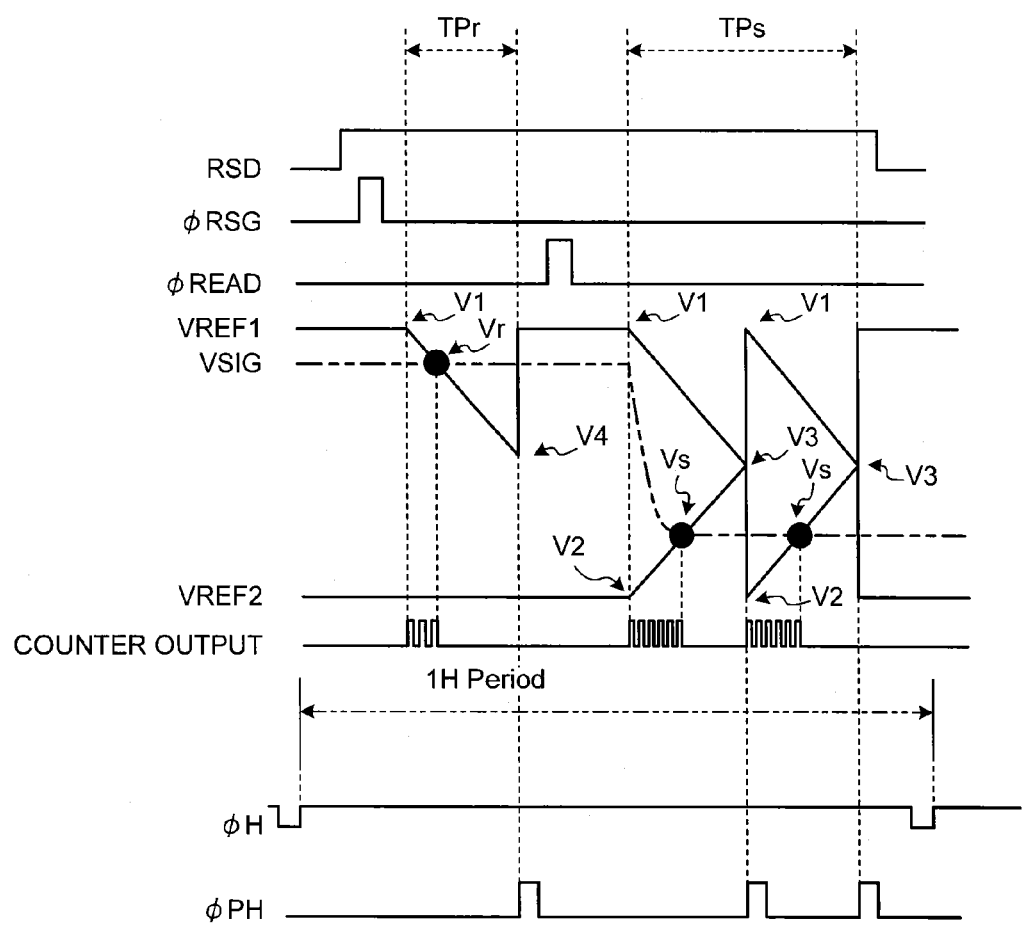
FIG. 11 is a waveform diagram showing an operation of the solid-state imaging device according to the third embodiment.

As shown in FIGS. 10 and 11, in the time period TPs for sampling the signal level of the pixel PC, the first slope voltage VREF1 temporally changes with a first gradient from a level V1 to an intermediate level V3 a plurality of times (such as twice). Specifically, since the time width between the levels V1 and V3 of the first slope voltage VREF1 is reduced to almost a half of the time width between the levels V1 and V2 of the slope voltage VREF of the basic form, it is possible to perform the sampling of the signal level Vs a plurality of times (such as twice) by using the waveform between the levels V1 and V3 twice, while setting the length of the time period Ts for sampling the signal level Vs to be almost the same as the basic form.

The generation circuit 106Bj generates a second slope voltage VREF2 having a plurality of ramp-like waveforms in the time period TPs for sampling the signal level of the pixel PC.

As shown in FIGS. 10 and 11, in the time period TPs for sampling the signal level of the pixel PC, the second slope voltage VREF2 temporally changes with a second gradient from a level V2 to the intermediate level V3 a plurality of times (such as twice). Specifically, since the time width between the levels V2 and V3 of the second slope voltage VREF2 is reduced to almost a half of the time width between the levels V1 and V2 of the slope voltage VREF of the basic form, it is possible to perform the sampling of the signal level Vs a plurality of times (such as twice) by using the waveform between the levels V2 and V3 twice, while setting the length of the time period Ts for sampling the signal level Vs to be almost the same as the basic form.

When the CDS circuit 81 receives the digital signal Vouts corresponding to the count value of the signal level Vs, it obtains the difference between the digital signal Voutr and the digital signal Vouts, and outputs this difference as a digital value Data to the averaging part 184*j*. The CDS circuit 81 performs this outputting of a digital value Data to the averaging part 184*j* a plurality of times (such as twice).

The averaging part 184*j* receives a digital value Data from the CDS circuit 81 a plurality of times (such as twice). Every time the averaging part 184*j* receives a digital value Data, it holds this digital value Data until it receives a digital value Data in the final round of the plurality of times. When the averaging part 184*j* receives a digital value Data in the final round of the plurality of times, it averages a plurality of digital values Data. The averaging part 184*j* outputs the averaged digital value Data' to the ISP 96.

As described above, according to the third embodiment, the AD conversion circuit 101*j* of each of the columns of the solid-state imaging device 195*j* is configured such that, when the output signal ΦCP1 of the comparator CP1 is inverted, the digital signal processing circuit 108*j* generates a digital value Data corresponding to a count value of the counter 142 in each of a plurality of changes of the first slope voltage VREF1, and then it averages a plurality of digital values thus generated and outputs the result. On the other hand, when the output signal ΦCP2 of the comparator CP2 is inverted, the digital signal processing circuit 108*j* generates a digital value Data corresponding to a value obtained by subtracting a count value of the counter 142 from the full count value of the reference counter 109 in each of a plurality of changes of the second slope voltage VREF2, and then it averages a plurality of digital values thus generated and outputs the result. Consequently, it is possible to easily reduce influences of the pixel random noise and to easily increase the pixel signal dynamic range, while setting the length of the time period for sampling the signal level to be almost the same as the basic form.

Figure 12A:
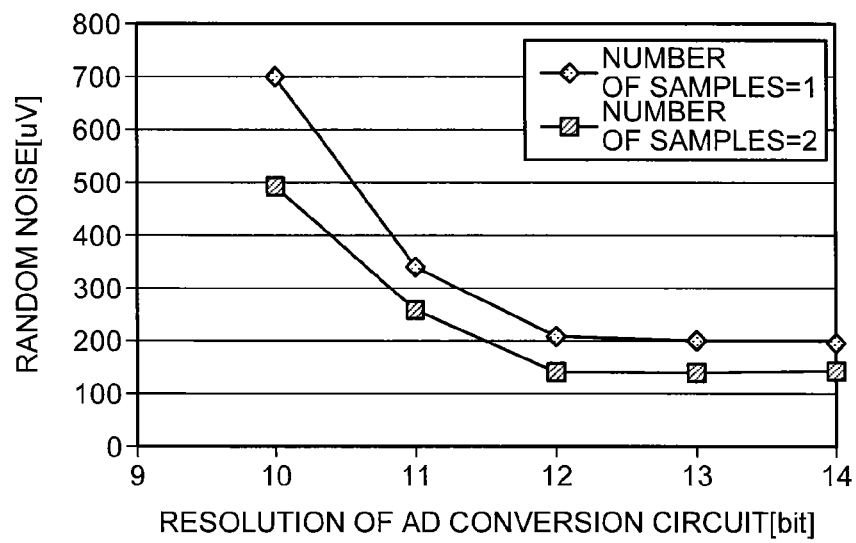
FIGS. 12A and 12B are graphs showing effects obtained by the third embodiment.

For example, FIG. 12A is a graph showing the relationship between the resolution of the AD conversion circuit and the pixel random noise in a case where the number of samples of the signal level is varied. When the number of samples of the signal level is increased as shown in FIG. 10, the random noise is reduced even if the resolution of the AD conversion circuit is constant. For example, when the number of samples is doubled, the random noise is reduced to $1/\sqrt{2}$.

Figure 12B:
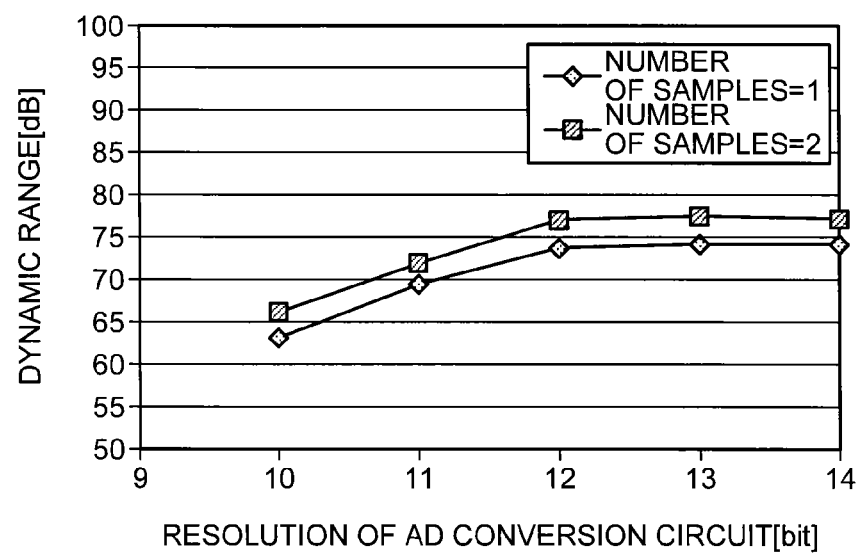

FIG. 12B is a graph showing the relationship between the resolution of the AD conversion circuit and the pixel signal dynamic range in a case where the number of samples of the signal level is varied. When the number of samples of the signal level is increased as shown in FIG. 11, the pixel signal dynamic range is increased even if the resolution of the AD conversion circuit is constant. For example, when the number of samples is doubled, the pixel signal dynamic range is increased by 3 dB.

Fourth Embodiment

Next, an explanation will be given of a solid-state imaging device 295 according to a fourth embodiment. Hereinafter in this embodiment, parts different from those of the first embodiment will be mainly described.

The first embodiment uses the full count value of the reference counter 109 to obtain the count value of the essential signal level when the signal level Vr is closer to the pixel saturation level, but the fourth embodiment uses a down counter to obtain the count value of the signal level when the signal level Vr is closer to the pixel saturation level.

Figure 14:
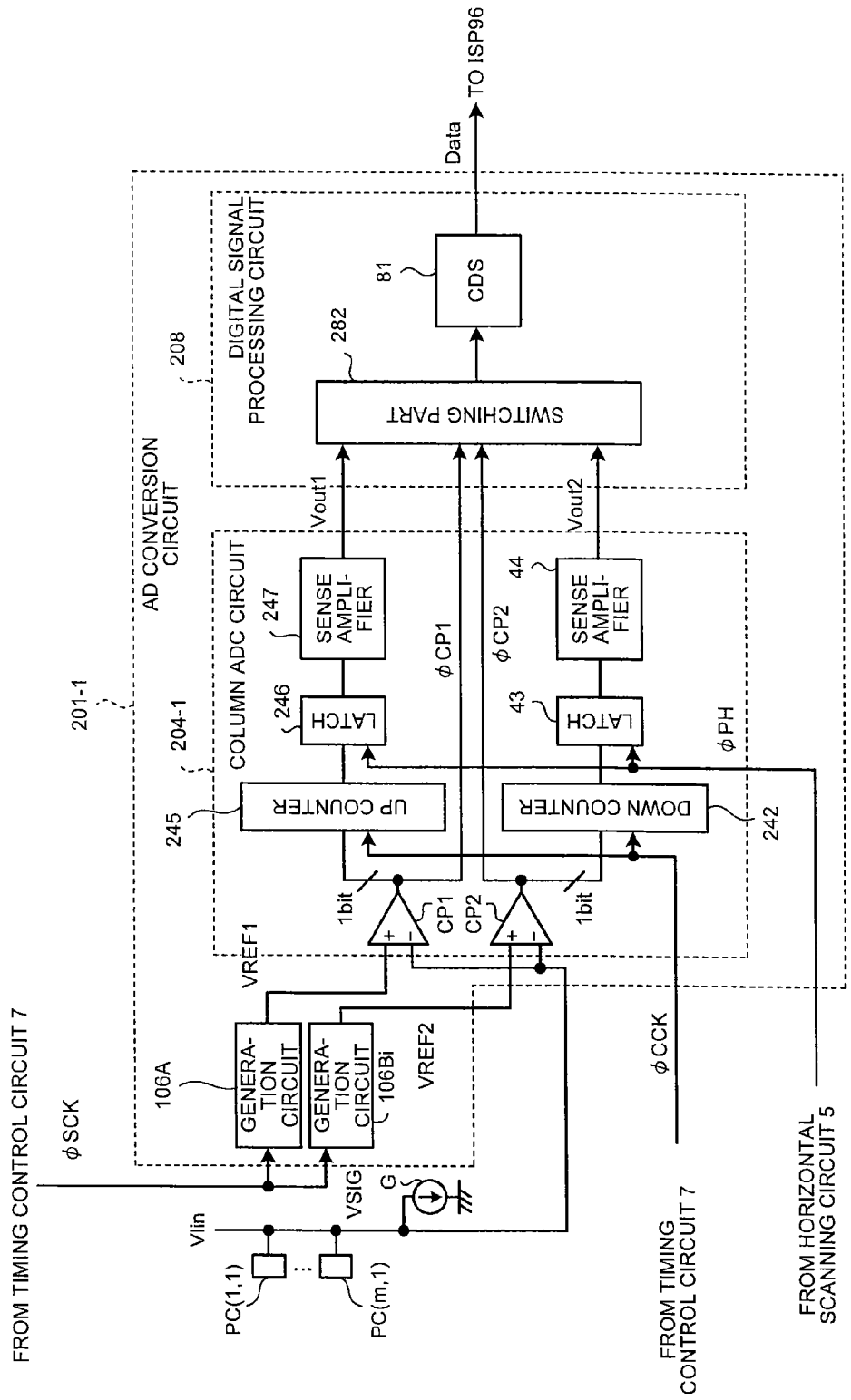
FIG. 14 is a diagram showing a configuration of an AD conversion circuit according to the fourth embodiment.

Specifically, in the solid-state imaging device 295, for example, AD conversion circuits 201-1 to 201-*n* respectively provided for the columns are configured such that the reference counter 109 is excluded as shown in FIG. 13. FIG. 13 is a diagram showing a configuration of the solid-state imaging device 295. For example, each of the AD conversion circuits 201-1 to 201-*n* of the columns is configured as shown in FIG. 14. FIG. 14 is a diagram showing a configuration of the AD conversion circuit of each column. FIG. 14 shows the AD conversion circuit 201-1 corresponding to the first column of a pixel array PA as an example, and the other AD conversion circuits 201-2 to 201-*n* corresponding to the other columns of the pixel array PA have similar configuration to this configuration.

The AD conversion circuit 201-1 includes a column ADC circuit 204-1 and a digital signal processing circuit 208 in place of the column ADC circuit 104-1 and the digital signal processing circuit 108 (see FIG. 2).

The column ADC circuit 204-1 includes a down counter (second counter) 242 in place of the counter 142 (see FIG. 2), and further includes an up counter (first counter) 245, a latch circuit 246, and a sense amplifier 247. In the column ADC circuit 204-1, the comparison result of the comparator CP1 is input to the up counter 245, and the comparison result of the comparator CP2 is input to the down counter 242.

As regards the signal level Vs, the up counter 245 counts up the number of clocks from the zero count value, from the time when the potential level of the first slope voltage VREF1 starts changing to the time when the comparison result ΦCP1 of the comparator CP1 is inverted. The zero count value is a count value corresponding to the level V1 of the first slope voltage VREF1. The up counter 245 outputs the count value of the signal level Vs to the latch circuit 246.

As regards the signal level Vs, the down counter 242 counts down the number of clocks from the full count value, from the time when the potential level of the second slope voltage VREF2 starts changing to the time when the comparison result ΦCP2 of the comparator CP2 is inverted. The full count value is a count value corresponding to the level V2 of the second slope voltage VREF2. The down counter 242 outputs the count value of the signal level Vs to the latch circuit 43.

The counting operation by the up counter 245 (a count up operation from the zero count value) it's the counting operation by the down counter 242 (a count down operation from the full count value) are performed in parallel with each other. The latch circuit 246 latches the count value of the up counter 245 and transfers it to the sense amplifier 247, and in parallel with this, the latch circuit 43 latches the count value of the down counter 242 and transfers it to the sense amplifier 44. Further, the sense amplifier 247 outputs a digital signal Vout1 to the switching part 282, and in parallel with this, the sense amplifier 44 outputs a digital signal Vout2 to the switching part 282. The digital signal Vout1 is a digital signal corresponding to a count value of the up counter 245, and the digital signal Vout2 is a digital signal corresponding to a count value of the down counter 242.

When the output signal ΦCP1 of the comparator CP1 is inverted, the digital signal processing circuit 208 generates and outputs a digital value Data corresponding to a count value of the up counter 245. On the other hand, when the output signal ΦCP2 of the comparator CP2 is inverted, the digital signal processing circuit 208 generates and outputs a digital value corresponding to a count value of the down counter 242.

As shown in FIG. 14, the digital signal processing circuit 208 does not include the subtracting part 183 (see FIG. 2), but includes a switching part 282 in place of the switching part 182 (see FIG. 2).

The switching part 282 receives the output signals ΦCP1 and ΦCP2 respectively from the comparators CP1 and CP2, receives the digital signal Vout1 from the sense amplifier 247 of each column, and receives the digital signal Vout2 from the sense amplifier 44 of each column. In accordance with the output signals ΦCP1 and ΦCP2, the switching part 282 can recognize which one of the output signals of the two comparators CP1 and CP2 has been inverted.

When the output signal ΦCP1 of the comparator CP1 is inverted, the switching part 282 selects the digital signal Vouts1 corresponding to the count value of the signal level Vs of the up counter 245, and transfers it to the CDS circuit 81. At this time, the switching part 282 may discard the digital signal Vouts2 corresponding to the count value of the signal level Vs of the down counter 242. Thus, when the CDS circuit 81 receives the digital signal Vouts1 corresponding to the count value of the signal level Vs, it obtains the difference between the digital signal Voutr1 and the digital signal Vouts1, and outputs this difference as a digital value Data.

On the other hand, when the output signal ΦCP2 of the comparator CP2 is inverted, the switching part 282 selects the digital signal Vouts2 corresponding to the count value of the signal level Vs of the down counter 242, and transfers it to the CDS circuit 81. At this time, the switching part 282 may discard the digital signal Vouts1 corresponding to the count value of the signal level Vs of the up counter 245. Thus, when the CDS circuit 81 receives the digital signal Vouts2 corresponding to the count value of the signal level Vs, it obtains the difference between the digital signal Voutr1 and the digital signal Vouts2, and outputs this difference as a digital value Data.

As described above, according to the fourth embodiment, the AD conversion circuit 201 of each of the columns of the solid-state imaging device 295 is configured such that, when the output signal ΦCP1 of the comparator CP1 is inverted, the digital signal processing circuit 208 generates and outputs a digital value Data corresponding to a count value of the up counter 245. On the other hand, when the output signal ΦCP2 of the comparator CP2 is inverted, the digital signal processing circuit 208 generates and outputs a digital value corresponding to a count value of the down counter 242. In this case, when the signal level Vs is closer to the pixel saturation level V2 than the intermediate level V3, the count value of the signal level can be obtained without using the full count value of the reference counter 109. Consequently, it is possible to further reduce the total time necessary for performing the pixel count to generate and output a digital value (one horizontal period).

It should be noted that the up counter 245 may comprise an up-down counter that can be switched to perform a count up operation. The down counter 242 may comprise an up-down counter that can be switched to perform a count down operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An AD conversion circuit of a single slope type comprising:
   a first comparator configured to compare a potential level of a first slope voltage, which temporally changes with a first gradient from a first level to an intermediate level, with a potential level of an analog signal from a pixel;
   a second comparator configured to compare a potential level of a second slope voltage, which temporally changes with a second gradient from a second level to the intermediate level, with a potential level of the analog signal from the pixel, the second gradient being inclined opposite to the first gradient;
   a counter configured to count number of clocks, in a state where the potential level of the first slope voltage and the potential level of the second slope voltage concurrently change, until an output signal of either one of the first comparator and the second comparator is inverted;
   a reference counter configured to constantly output a full count value; and
   a generation circuit configured to generate and output a digital value corresponding to a count value of the counter when an output signal of the first comparator is inverted, and to generate and output a digital value corresponding to a value obtained by subtracting a count value of the counter from the full count value of the reference counter when an output signal of the second comparator is inverted.

2. The AD conversion circuit according to claim 1, wherein the first level is a level corresponding to a zero count value of the counter,
   the second level is a level corresponding to the full count value of the reference counter, and
   the intermediate level is a level corresponding to an intermediate count value between the zero count value of the counter and the full count value of the reference counter.

3. The AD conversion circuit according to claim 1, wherein the second slope voltage is kept at a level corresponding to the full count value, or is operated in a same manner as the first slope voltage, in a time period for sampling a reset level of the pixel.

4. The AD conversion circuit according to claim 2, wherein number of bits of the counter is one-bit smaller than number of bits of the reference counter.

5. The AD conversion circuit according to claim 1, wherein the generation circuit includes
   a subtracting part, and
   a switching part configured to transfer a count value of the counter to an output side of the generation circuit so as to bypass the subtracting part when an output signal of the first comparator is inverted, and to transfer a count value of the counter to the subtracting part when an output signal of the second comparator is inverted, and
   wherein the subtracting part is configured to subtract a count value of the counter from the full count value of the reference counter and to output a subtraction result to an output side of the generation circuit, when receiving the count value of the counter through the switching part.

6. The AD conversion circuit according to claim 1, wherein the first comparator and the second comparator are configured to perform sampling of a signal level of the pixel in parallel.

7. The AD conversion circuit according to claim 6, wherein the first comparator and the second comparator are configured to perform signal level sampling one or more times in a time period for sampling a signal level of the pixel.

8. The AD conversion circuit according to claim 6, wherein sampling of a reset level of the pixel is performed by the first comparator or the second comparator.

9. The AD conversion circuit according to claim 1, wherein
the first slope voltage changes from the first level to the intermediate level a plurality of times in a time period for sampling a signal level of the pixel,
the second slope voltage changes from the second level to the intermediate level a plurality of times in the time period for sampling a signal level of the pixel, and
the generation circuit is configured to generate a digital value corresponding to a count value of the counter in each of a plurality of changes of the first slope voltage, and provide an output obtained by averaging a plurality of digital values thus generated, when an output signal of the first comparator is inverted, and to generate a digital value corresponding to a value obtained by subtracting a count value of the counter from the full count value of the reference counter in each of a plurality of changes of the second slope voltage, and provide an output obtained by averaging a plurality of digital values thus generated, when an output signal of the second comparator is inverted.

10. A solid-state imaging device comprising:
a plurality of pixels arrayed in a form of a plurality of rows and a plurality of columns; and
a plurality of AD conversion circuits arranged to correspond respectively to the columns of the pixels, comprising an AD conversion circuit of a single slope type including:
a first comparator configured to compare a potential level of a first slope voltage, which temporally changes with a first gradient from a first level to an intermediate level, with a potential level of an analog signal from the pixel;
a second comparator configured to compare a potential level of a second slope voltage, which temporally changes with a second gradient from a second level to the intermediate level, with a potential level of the analog signal from the pixel, the second gradient being inclined opposite to the first gradient;
a counter configured to count number of clocks, in a state where the potential level of the first slope voltage and the potential level of the second slope voltage concurrently change, until an output signal of either one of the first comparator and the second comparator is inverted;
a reference counter configured to constantly output a full count value; and
a generation circuit configured to generate and output a digital value corresponding to a count value of the counter when an output signal of the first comparator is inverted, and to generate and output a digital value corresponding to a value obtained by subtracting a count value of the counter from the full count value of the reference counter when an output signal of the second comparator is inverted.

11. The solid-state imaging device according to claim 10, wherein
the reference counter is shared by the plurality of AD conversion circuits.

12. The solid-state imaging device according to claim 10, further comprising a plurality of light shielding pixels arranged adjacent to the plurality of pixels,
wherein the reference counter is arranged in a dummy area corresponding to the plurality of light shielding pixels and adjacent to an area in which the plurality of AD conversion circuits are arranged.

13. The solid-state imaging device according to claim 10, wherein
the reference counter is configured to constantly output a full count value in each of a time period for sampling a reset level of the pixel and a time period for sampling a signal level of the pixel.

14. The solid-state imaging device according to claim 10, wherein
the first slope voltage changes from the first level to the intermediate level a plurality of times in a time period for sampling a signal level of the pixel,
the second slope voltage changes from the second level to the intermediate level a plurality of times in the time period for sampling a signal level of the pixel, and
the generation circuit is configured to generate a digital value corresponding to a count value of the counter in each of a plurality of changes of the first slope voltage, and provide an output obtained by averaging a plurality of digital values thus generated, when an output signal of the first comparator is inverted, and to generate a digital value corresponding to a value obtained by subtracting a count value of the counter from the full count value of the reference counter in each of a plurality of changes of the second slope voltage, and provide an output obtained by averaging a plurality of digital values thus generated, when an output signal of the second comparator is inverted.

* * * * *